US 6,744,037 B2

(12) United States Patent
Yoshikawa et al.

(10) Patent No.: US 6,744,037 B2
(45) Date of Patent: Jun. 1, 2004

(54) METHOD FOR MEASURING SCAN BEAM LIGHT QUANTITY DISTRIBUTION IN SCAN OPTICAL SYSTEM, MEASUREMENT APPARATUS THEREOF, MEASUREMENT EVALUATION APPARATUS THEREOF, AND IMAGE FORMATION APPARATUS USING THE MEASUREMENT EVALUATION APPARATUS

(75) Inventors: Hiroshi Yoshikawa, Tokyo (JP); Naohiro Kamijo, Tokyo (JP); Teruki Kamada, Tokyo (JP); Masato Takada, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 70 days.

(21) Appl. No.: 09/948,571

(22) Filed: Sep. 10, 2001

(65) Prior Publication Data

US 2002/0043611 A1 Apr. 18, 2002

(30) Foreign Application Priority Data

Sep. 11, 2000 (JP) .......................................... 2000-275239
Mar. 22, 2001 (JP) .......................................... 2001-082485

(51) Int. Cl.[7] .............................. H01J 3/14; H04N 1/04; B41J 2/47
(52) U.S. Cl. ........................ 250/234; 347/225; 358/474
(58) Field of Search .......................... 250/234, 235, 250/236; 347/225, 231, 250; 359/212, 216–219, 197; 358/474, 475, 493, 494

(56) References Cited

U.S. PATENT DOCUMENTS

| 5,241,174 | A | * | 8/1993 | Ando | .................... 250/235 |
| 5,719,404 | A | * | 2/1998 | Tsai | ..................... 250/559.29 |
| 5,912,458 | A | * | 6/1999 | Squires et al. | .............. 250/234 |
| 6,239,883 | B1 | * | 5/2001 | Lam et al. | .................. 358/475 |
| 6,268,876 | B1 | * | 7/2001 | Ozaki et al. | ................ 347/225 |
| 6,532,084 | B1 | * | 3/2003 | Chiu | ......................... 358/475 |

FOREIGN PATENT DOCUMENTS

JP 9-43527 2/1997

* cited by examiner

Primary Examiner—Stephone B. Allen
(74) Attorney, Agent, or Firm—Oblon, Spivak, McClelland, Maier & Neustadt, P.C.

(57) ABSTRACT

A scan beam light quantity distribution method and apparatus using a two-dimensional area light receiving sensor (8) movable in the same direction as scan direction of a scan beam. The two-dimensional area light receiving sensor (8) detects a scan beam while moving in the scan direction of the scan beam. The scan beam received by the two-dimensional area light receiving sensor (8) is correlated with position information when stored in data storage section (10.) By using scan beam data stored in the data storage section, analysis is made on a light quantity distribution of the scan beam scanned in X-direction.

10 Claims, 12 Drawing Sheets

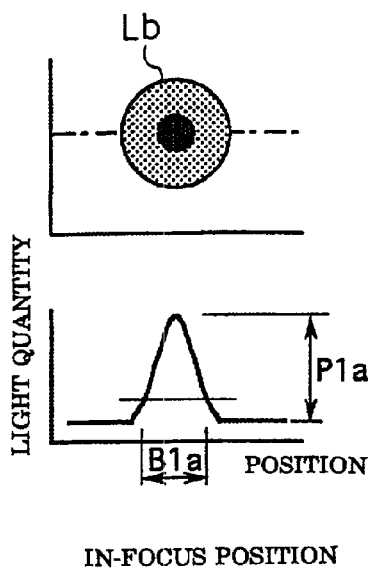
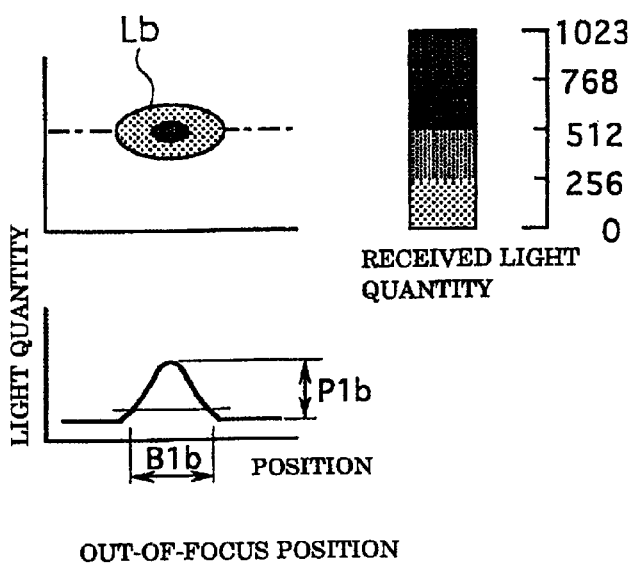
FIG. 5(a) IN-FOCUS POSITION
FIG. 5(b) OUT-OF-FOCUS POSITION
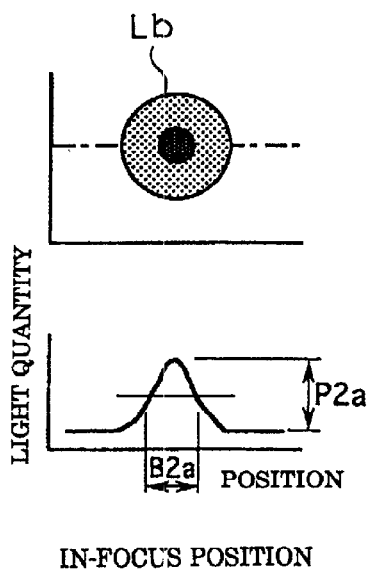
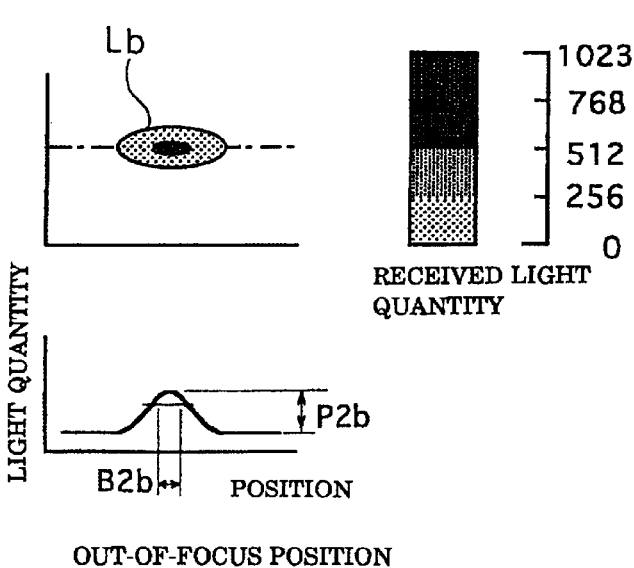
FIG. 6(a) IN-FOCUS POSITION
FIG. 6(b) OUT-OF-FOCUS POSITION

BEAM WITH SMALL SIDE LOBE

BEAM WITH LARGE SIDE LOBE

BEAM WITH SMALL SIDE LOBE

BEAM WITH LARGE SIDE LOBE

METHOD FOR MEASURING SCAN BEAM LIGHT QUANTITY DISTRIBUTION IN SCAN OPTICAL SYSTEM, MEASUREMENT APPARATUS THEREOF, MEASUREMENT EVALUATION APPARATUS THEREOF, AND IMAGE FORMATION APPARATUS USING THE MEASUREMENT EVALUATION APPARATUS

BACKGROUND OF THE INVENTION

1. Field of the Invention

The present invention relates to a scan beam light quantity distribution measurement method and a measurement apparatus of scan optical system, and more particularly to a scan beam light quantity distribution measurement method, a measurement apparatus, a measurement evaluation apparatus. The present invention also relates to an image formation apparatus with the measurement evaluation apparatus capable of evaluating quality of an optical element used in a scanning optical unit to include detecting the influence on optical performance by profile irregularities, a surface defect, an internal defect while measuring light quantity distribution of a scan beam in the scanning optical unit.

2. Description of the Prior Art

A write scanning optical unit used for an image formation apparatus such as a laser printer, a copy machine, a facsimile apparatus and so forth has a scan optical system constituted mainly by a laser light source, a collimator lens, various kinds of lenses and mirrors, a polygon mirror and so forth. In general, the image formation apparatus transforms laser beam generated from a laser light source into parallel light using the Collimator lens to irradiate to the polygon mirror, where the parallel light is deflected by a revolution of the polygon mirror. The reflected light beam is focused as a point image on a photosensitive body by an imaging lens and a mirror system. An electrostatic latent image is formed on the photosensitive drum by performing laser beam scan in the horizontal scan direction obtained by revolution of such a polygon mirror and in the vertical scan direction obtained by revolution of the photosensitive drum.

Further, it is known that toner is applied to the surface of the photosensitive drum having the electrostatic latent image thereon, thereby forming a toner image on the surface of the photosensitive drum. Subsequently, the toner image on this photosensitive drum is transferred onto a transfer sheet and fixed thereon. Thus an image is formed on this transfer sheet.

Now, when the optical elements constituting the scan optical system have abnormalities such as profile irregularities (undulation), a surface defect, an internal defect, and so forth, the scanning position of the scan beam on the photosensitive body is deviated in the horizontal scan direction, and out-of-focus condition in the depth direction of the scan beam occurs. Such position deviation deteriorates the peak light quantity of the scan beam and/or affects size of diameter and shape of the scan beam, thus causing faulty image formation.

The conventional approach for evaluating beam diameters of light beams include using a pin hole or slit in a position corresponding to surface of the photosensitive drum and setting a photo-detector immediately at the rear thereof, so that the beam diameter is measured in a stationary state. Then an evaluation is made whether the scan optical system has a defect by judging whether a point of abrupt change is present in the beam diameter thus measured.

However, this conventional measurement method of the beam diameter requires excessive measuring times when measurement across the entire scanning area in every predetermined pitch (for instance, when measuring across the entire scanning area in every 1 mm). Further, since the measurement is executed only against a stationary beam, there is problem that scanning beam characteristic cannot be measured.

Furthermore, the beam diameter is measured with respect to peak intensity of the beam and accordingly, there is the problem that the conventional evaluation does not account for absolute amount of the intensity.

Various kinds of methods have been suggested for measuring scan beams generated by an optical system. For instance, it is described in Japanese Patent Application Laid-Open No. HEI 9-43527. This application discloses a scan beam measurement method and a measurement evaluation apparatus using three pieces of beam position sensors, one beam diameter sensor, and one light quantity sensor equipped on a movable stage. In the apparatus, the beam diameter and the light quantity of the scan beam measured while moving the beam diameter sensor and the light quantity sensor with the movable stage while ascertaining the photo-sensed position of the beam position sensor.

However, in such a conventional measurement method, there are following problems, namely:

While measurements of the beam diameter are made using the beam diameter sensor and measurements of irregularity of light quantity are made using the light quantity sensor, measurements of light quantity distribution of the scan beam cannot be measured.

Because measurements of the beam diameter are performed at distant positions, this measurement method cannot measure relative to neighboring beam diameters about degree of one pixel apart due to the arrangement of the beam position sensors.

While measurements of the beam diameter and the light quantity are made while moving the movable stage, this method measures the beam diameter at only predetermined positions, and it cannot measure the beam diameter at arbitrary positions along the entire horizontal scan direction. Moreover, measurement of the light quantity are executed only for the entire luminous flux of incident light, not for the distribution of the light quantity of the beam.

While beam position is measured using the beam position sensor at three positions, evaluation of magnification error cannot be preformed because accurate distances between respective beam position sensors are not known and it is impossible to detect distance between two points of beam.

Measuring at only three positions cannot determine accurate scanning line bend-amounts, because there is restriction in the number of arranged beam position sensors.

Also, while a scanning side beam detecting sensor is provided in the scan optical system, and three pieces of stage side beam detecting sensors are provided for detecting timing of incident scan beam at the movable stage to evaluate scanning side beam detecting sensor positioning, the conventional apparatus cannot emit beam of arbitrary light emission pattern to the stage side beam detecting sensor and also does not enable the scan beam to emit a light repeatedly because of the predetermined position of the stage side beam detecting sensor.

As stated previously, in conventional measurement beam diameter methods, when measuring across the entire scanning area (for instance, in every 1 mm) the measurements require excessive measuring times. Further, since the measurement is executed against a stationary beam, beam scanning characteristic cannot be measured.

As to a method for measuring the scan beam in the scan optical system, it can be considered to constitute a method by performing position measurement by the position detector of the movement means and synthesizing dot positions at this position, thereby detecting the dot position in the entire scan system.

In such a measurement apparatus, since measurement time and oscillation and so forth should be considered, instead of repeating movement and stopping for every measurement, beam position measurement is usually performed while moving two-dimensional sensor in the horizontal scan direction. However, when positions are stored at the time of generation of scanning reference signal and the beam positions are detected in the entire scanning area, measurement time errors described later are generated. This error cannot be ignored with respect to position instrumentation error when positioning instrumentation with high accuracy requirements.

Speed fluctuation of movement mechanism and influence of observation time upon position accuracy are now explained. Speed of a movement mechanism is taken to be V (mm/sec), movement speed fluctuation is taken to be δv (mm/sec), and scanning frequency of a laser line is taken to be F (1/sec). In scanning the line, movement of the movement mechanism L (mm) is "L=(V+δv)/F," movement amount error δL when speed fluctuation of the movable stage is about degree of ±10% is "δL=±0.1V/F." In the case of V=100, F=2000, δL becomes "δL=±5×10E−3 (mm)=±5 µm".

About correspondence to this deviation from the reference position, one can mount a triggering photo-detector PD on a front stage of a conventional detection system. However, by adding the triggering PD, not only does the apparatus configuration become complicated, but also requires extremely complicated lighting control such that the scan beam enters the triggering PD.

Further, if there is fluctuation in between a position detecting synchronizing signal and the time that position detection is actually executed, the beam position can be incorrect. For example, a fluctuation of detection time of PVHF under the aforementioned settings will result in a position error of 10 µm. Since the beam diameter of the scan system is smaller than 100 µm, an error of 10 µm is significant.

Furthermore, in order to minimize fluctuation of this detection time, it is necessary to constitute systems by using hardware dedicated for detection or by using real time OS whose real time characteristic under order of µsec is guaranteed. Accordingly apparatus cost rises in comparison with the case that control is executed with general-purpose PC.

SUMMARY OF THE INVENTION

In view of the foregoing, it is one object of the present invention to provide a method and apparatus for measuring a scan beam light quantity distribution in a scan optical system, taking into account profile irregularities (undulation), surface defects, internal defects, and so forth while retaining high accuracy.

BRIEF DESCRIPTION OF THE ATTACHED DRAWINGS

FIG. 5(a) shows a beam diameter of conventional scan beam in the focused position FIG. 5(b) shows a beam diameter of conventional scan beam in the non-focused position.

FIG. 6(a) shows a beam diameter of the scan beam of the first embodiment in the focused position.

FIG. 6(b) shows a beam diameter of the scan beam of the first embodiment in the non-focused position.

DETAILED DESCRIPTION OF THE PREFERRED EMBODIMENT

Hereinafter, a first embodiment of the present invention will be described with reference to the attached drawing.

FIG. 1 to FIG. 8 are views illustrating a scan beam light quantity distribution measurement method (scan beam light quantity distribution measurement/evaluation method) and a measurement apparatus (measurement/evaluation apparatus) of a scan optical system according to a first embodiment of the present invention.

Figure 1:
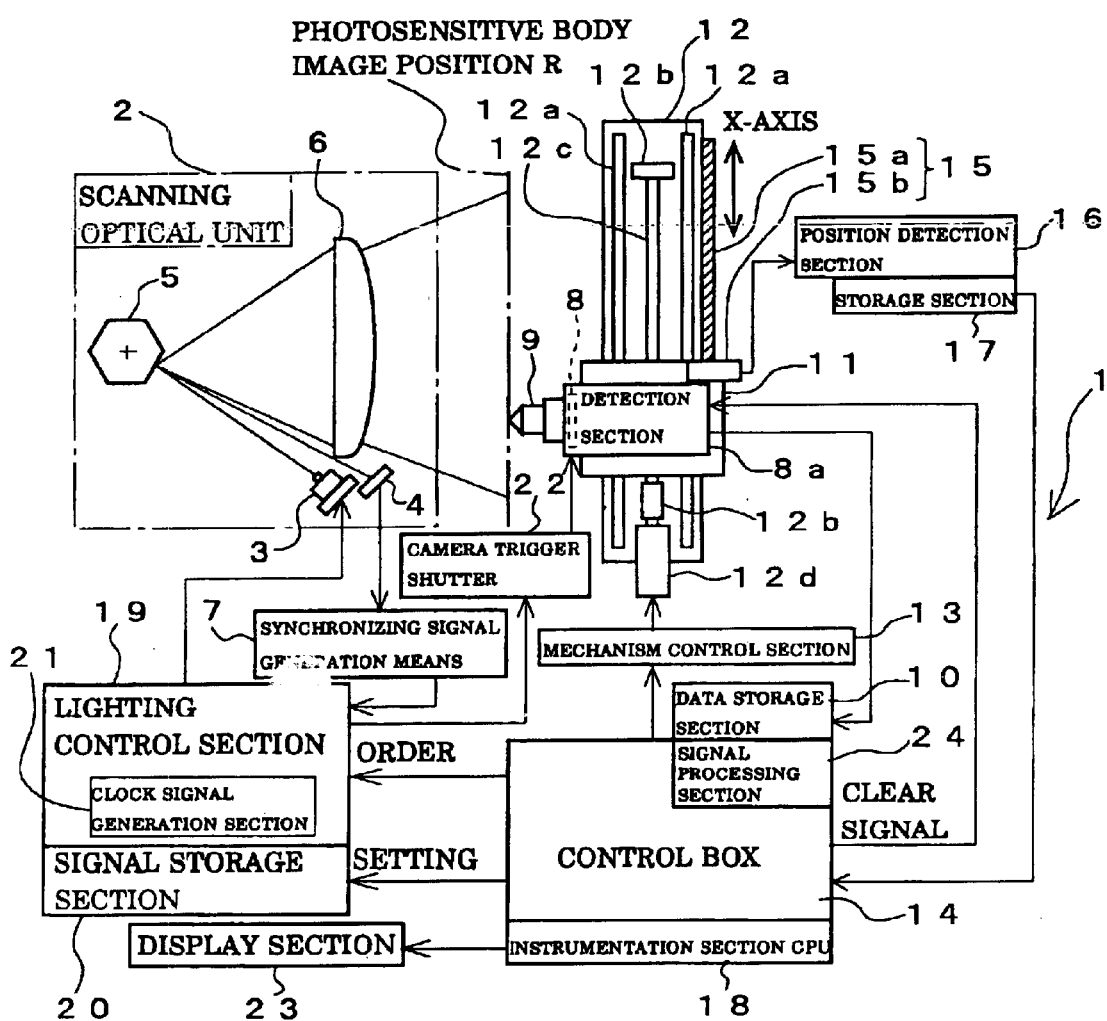
FIG. 1 illustrates a scan beam light quantity distribution measurement method and measurement apparatus of scan optical system according to a first embodiment of the present invention.

FIG. 1 is a view illustrating the scan beam light quantity distribution measurement apparatus. In the present embodiment, measurement of light quantity distribution is performed by setting a scan optical system 2 to this scan beam light quantity distribution measurement apparatus (scan beam measurement/evaluation apparatus) 1.

The scan optical system 2 is provided with a laser light source (light source) 3 consisting of a laser diode, a light receiving sensor 4 consisting of a photo diode as a reference position detecting means for detecting scanning start position of the scan beam, a polygon mirror (scanning means) 5 to be a revolving multiple mirror, an fθ-lens (scanning means) 6 and so forth. Further, the laser light source 3, the light receiving sensor 4, and the polygon mirror 5 are connected to the measurement apparatus 1 by connectors, so as to enable input/output to/from the measurement apparatus 1.

The scan optical system 2 is operated by the measurement apparatus 1. Further, a light beam emitted from the laser light source 3 is shaped into parallel luminous flux by Collimator lens (not depicted), and incidence of this parallel luminous flux to mirror surface of the polygon mirror 5 is performed through a cylindrical lens, before the light beam is subjected to deflection scanning by revolution of the polygon mirror 5. Further, the light beam being subjected to deflection scanning is received by the light receiving sensor 4, subsequently, being subjected to photoelectric conversion by the light receiving sensor 4 to be output to synchronizing signal generation means 7. The synchronizing signal generation means 7 generates synchronizing signal with this signal (light beam) as trigger.

On the other hand, the light beam which has been subjected to deflection scanning by the polygon mirror 5 is projected onto a straight line shaped photosensitive body image position R as a point image through long fθ lens 6. Extending direction of the straight line shaped photosensitive body image position R agrees with the horizontal scan direction of the photosensitive body (not illustrated). The point image formed, i.e., imaged, on the photosensitive body image position R is formed on a light receiving surface of a two-dimensional area light receiving sensor (two-dimensional area light receiving element) 8 consisting of CCD of the measurement apparatus 1 through an objective lens (magnification optical element) 9. The two-dimensional area light receiving sensor 8 serving as detection means (detection section) is arranged within a case 8a, and the objective lens 9 is mounted on the case 8a such that the objective lens 9 is installed and removed flexibly.

The light receiving sensor 8 detects a spot image of the scan beam enlarged by the objective lens 9 when received, and converts the spot image into electric signal to be output to a data storage section 10.

Further, the light receiving sensor 8 is mounted on an X-direction movable stage (moving means) 11. Below this X-direction movable stage (X-direction movable table), there is provided a Y-direction movable table (Y-direction movable stage) 12 extending in the X-direction (horizontal scan direction of the scan beam). Rails 12a, 12a extending in the X-direction are mounted on the Y-direction movable table 12. Further, the X-direction movable stage 11 is supported on the rails 12a, 12a in such a way as to be capable of moving in the longitudinal direction (X-direction). Thus, the X-direction movable stage 11 can move along the rails 12a, 12a.

Furthermore, a stage drive mechanism A is provided on the Y-direction movable table 12. The stage drive mechanism A includes: bearings 12b, 12b positioned between the rails 12b, 12b and mounted at the longitudinal end portion of the Y-direction table 12; a feed screw 12c provided in parallel with the rails 12a, 12a and rotatably supported on the bearings 12b, 12b; and a pulse motor (drive motor, drive means) 12d mounted on one end section of the Y-direction movable table 12 and having an output shaft connected to the feed screw 12c. Moreover, the feed screw 12c is screwed to a nut member (not depicted) provided at the movable stage 11.

The pulse motor 12d is subjected to drive control of forward revolution or reverse revolution by a mechanism control section such as motor driver (motor drive circuit) and so forth so that the feed screw 12c is made to revolute in forward revolution or reverse revolution so as to move the movable stage 11 in the X-direction. The mechanism control section 13 is subjected to operation control from an instrumentation section CPU 18 through a control box 14.

Further, the Y-direction movable table 12 is installed on a fixed table (not depicted) in such a way as to be capable of moving in forward and backward in Y-direction (direction at right angle to X-direction). Furthermore, the Y-direction movable table 12 is subjected to jog-mode movement control (drive control) in the Y-direction by a table drive mechanism (not depicted) having configuration identical to the stage drive mechanism (not shown) and a mechanism control section (movement control means) (not depicted) similar to the mechanism control section (movement control means) 13. This mechanism control section enables to adjust a micro-position deviation in the direction of the optical axis generated when the objective lens 9 is mounted on or removed from the case 8a.

As described above, since the light receiving sensor (two-dimensional area sensor) 8 is equipped with the X-direction movable stage 11, the light receiving sensor 8 is moved in the X-direction by the X-direction movable stage 11 in such a way that the X-direction movable stage 11 is driven in the X-direction by the mechanism control section 13 and the stage movement mechanism (not shown). For that reason, the two-dimensional area light receiving sensor 8 can detect the scan beam at an arbitrary position within the scanning area.

Further, a linear scale 15 (also optical measuring device, laser micro sensor and so forth are capable of being utilized) intervenes to be installed between the movable table 11 and the Y-direction movable table 12 as position detection means. This linear scale 15 has a main scale 15a extending in the X-direction and being fixed along a side section that extends in the longitudinal direction of the Y-direction movable table 12, and a detection head 15b that is mounted on the X-direction movable table 11 and the main scale 15a and the detection head 15b detect cooperatively movement position of the X-direction movable stage 11. Since such linear scale 15 is capable of adopting known configuration, detailed explanation is omitted. Moreover, also it is possible to use rotary encoder and so forth as the position detection means. In this case, it is possible to detect a movement position in the X-direction of the movable stage 11 in such a way as to detect revolution of the feed screw 12c depending on the rotary encoder.

Also, it is possible to detect a movement position in the Y-direction depending on position detection means (not illustrated) that is the same means as in the X-direction.

Further, detection signal (pulse signal) from the detection head 15b is input to a position detection section 16. The position detection section 16 finds movement amount or movement position in the X-direction of the X-direction movable stage 11 in such a way as to count the pulse signal (detection signal).

Furthermore, position information of the X-direction movable stage 11 detected by the position detection section 16 is stored in a storage section (memory section or recording section) 17. It is possible to use storage medium such as memory or a recording medium such as hard disk as the storage section 17.

Position data stored in the storage section 17 is output to the control box 14. Moreover, the linear scale 15 and the position detection section 16 constitute position detection means.

On the other hand, the laser light source 3 is subjected to light emission control by a lighting control section 19 that is subjected to operation control due to a synchronizing signal from the synchronizing signal generation means 7. Namely, the synchronization signal generation means 7 executes operation control of the lighting control section 19 while receiving detection signal when the light receiving sensor 4 detects scanning start position of the scan beam. By this operation, the lighting control section 19 causes light emission of the laser light from the laser light source 3 to start and controls the laser light source 3.

The lighting control section (selection/emission control means) 19 drives the laser light source 3 on the basis of a plurality of light emission patterns stored in a signal storage section 20. Further, the signal storage section 20 stores therein the amount of the laser light emitted by the laser light source 3, and the time that the laser light source emits. Furthermore, the existence of lighting patterns (a) the laser light source 3 is made to execute lighting of only one time during one scanning period of the laser light according to the polygon mirror 5, (b) the laser light source 3 is made to execute a plurality of lightings in every constant time, (c) the laser light source 3 is made to execute lighting continuously to make continuous light, or (d) the laser light source 3 is made to execute lighting with constant time intervals, or so forth are stored in the signal storage section 20. Moreover, the signal storage section 20 stores therein lighting timing at the time of lighting of the laser light source 3 (namely a projection position onto the straight line shaped photosensitive body image position R) depending on lighting of the laser light source 3, and patterns of light quantity of the laser light source 3.

Further, the lighting control section 19 is subjected to operation control depending on an order from the instrumentation section CPU 18 through the control box 14, and executes light emission control of the laser light source 3 while matching to a clock signal of a predetermined frequency that is generated from a clock signal generation means 21 in such a way as to emit a laser light scan beam from the laser light source 3 at the predetermined frequency.

Furthermore, the light receiving surface of the two-dimensional area light receiving sensor 8 is in the condition of free-to-open-and-shut depending on a camera trigger shutter 22. The two-dimensional area light receiving sensor 8 receives light of the scan beam when the shutter 22 is released. As to the camera trigger shutter 22, any known electronic shutter (e.g., liquid crystal) or mechanical shutter may be used.

Here, the control box 14 makes it possible to select mirror surface of the polygon mirror 5 that performs reflection scanning of the laser light in such a way as to count the synchronization signal generated by the synchronization signal generation means 7 in compliance with the number of surfaces (6 surfaces in the present embodiment) of the polygon mirror 5. Namely, the control box 14 is capable of setting timing of the light control section 19 that drives the laser light source 3 in such a way that laser light from the laser light source 3 is sent into the specific mirror surface of the polygon mirror 5.

Further, the two-dimensional area light receiving sensor 8 stores charges when receiving scan beam. This charge storage time is determined by switching time of opening and closing of the shutter 22. The time of opening condition of the shutter 22 is set for instance, in such a way that the shutter 22 closes corresponding to just one scanning of the scan beam.

In the present embodiment, when the lighting control section 19 causes the laser light source 3 to emit a light with predetermined light emission pattern, the laser light from the laser light source 3 is scanned by the polygon mirror 5 to come into scan beam. Then this scan beam is imaged by the two-dimensional area light receiving sensor 8. An image signal from the two-dimensional area light receiving sensor 8 is input to the control box 14 as the image data depending on an order of the instrumentation section CPU 18. The image data so obtained is transferred to the data storage section (data storage means) 10. At this time, the position information obtained by the position detection section 16 is transferred from the storage section 17 to the instrumentation section CPU 18. Thus, it is possible to easily correlate the two-dimensional area light receiving sensor 8 receives scan beam at which position in the scan direction of the scan beam.

Further, as described-above, the two-dimensional area light receiving sensor 8 outputs the stored charges in response to an order from the instrumentation section CPU 41 as the image signal to input to the data storage section 10. Furthermore, the instrumentation section CPU 18 transmits a clear signal to the two-dimensional area light receiving sensor 8 through control box 14 at the same time that output of the image signal to the data storage section 10 from the two-dimensional area light receiving sensor 8 is completed, followed by clearing charges stored in the two-dimensional area light receiving sensor 8. This allows the two-dimensional area light receiving sensor 8 to be returned to the condition capable of detecting another scan beam.

Moreover, the two-dimensional area light receiving sensor 8 of the present embodiment is set such that the two-dimensional area light receiving sensor 8 executes A/D conversion of the amount of the received light. For instance, sensor 8 executes an A/D conversion of the amount of the received light into data of 10 bits to form image data of 1024 gradations.

In the present embodiment, the two-dimensional area light receiving sensor 8 acquires the image data and transmits the acquired image data toward the data storage section 10 while moving in the X-axis direction (that is the horizontal scan direction), and repeats this transmission routine across the entire scanning area of the straight line shaped photosensitive body image position R so as to acquire the image data corresponding to one scanning line. Subsequently, signal processing section 24 measures the light quantity distribution of the scan beam so that imaged light quantity distribution data can be analyzed by the control box 14.

Then, the instrumentation section CPU 18 finds the image data of the scan beam on the basis of the measurement result, and calculates a cross sectional profile in the scan direction and vertical scan direction, before the obtained image data and the cross-sectional profile are presented to the display section 23. In the present embodiment, the control box 14 and the instrumentation section CPU 18 constitutes analysis means, i.e., measurement evaluation means.

In the present embodiment, this measurement evaluation means, at the time that the light quantity distribution of the scan beam is made to analyze, measures beam diameter of the scan beam at a light quantity threshold value. It is possible to arbitrary set the threshold value on the basis of light quantity distribution to determine the diameter of the scan beam. The threshold value is set to equivalent to a light quantity that allows the transfer of toner normally onto surface of the photosensitive body when the scan beam is irradiated onto the surface of the photosensitive body.

Figure 2:
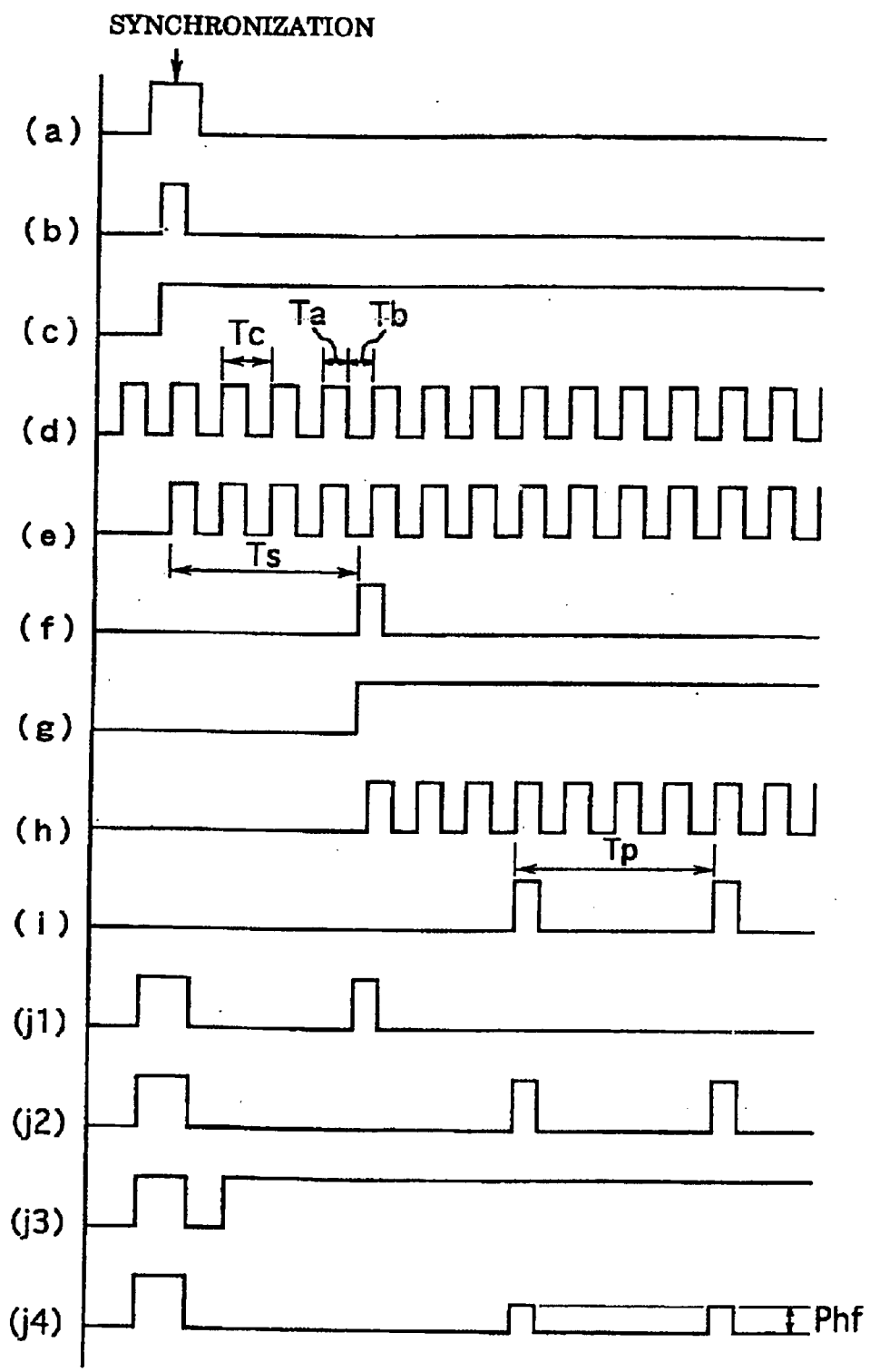
FIG. 2 is a timing chart of signal generation control section of a scan beam pattern of the first embodiment.

FIG. 2 illustrates a timing chart in a signal generation control section of a scan beam pattern of the present embodiment.

In FIG. 2, (a) indicates a fundamental signal of the laser light source 3. In this fundamental signal, in order to obtain a synchronizing signal to come to scanning start position of the scan beam, namely, in order to receive light certainly by the light receiving sensor 4, the laser light source 3 is made to emit a light while adding certain degree of allowances.

Also, in FIG. 2, (b) indicates trigger signal (light receiving trigger) on the basis of light receiving signal (light detection signal) output from this light receiving sensor 4 when the light receiving sensor receives light. In FIG. 2, (c) indicates signal that maintains timing of light receiving of the light receiving sensor 4 of (b). Further, (d) indicates a clock signal that is generated from the clock signal generation means 21 at all time.

Further, in FIG. 2, (e) indicates AND signal of (c) and (d). In FIG. 2, (f) indicates signal that is generated on the basis of a program at the instrumentation section CPU 18, and Ts is capable of being set as time which is time interval from synchronizing signal generated from the synchronizing signal generation means 7.

Furthermore, in FIG. 2, (g) indicates signal that is maintained of state of (f). In FIG. 2, (h) indicates AND signal of (e) and (g). In FIG. 2, (i) indicates the number of clock that enters into (h) counted by a counter. In FIG. 2, Tp is set as quad counter.

Moreover, in FIG. 2, (j1) to (j4) are used for light emission of the actual laser light source 3, and (j1) is 1 dot signal that is generated from AND signal of (a) and (f). In FIG. 2, (j2) is dot line signal that is generated from AND signal of (a) and (i).

Also, (j3) is continuous light that is generated from AND signal of (a) and (g). Also, (j4) is halftone that is generated from AND signal between signal (i) which has half of normal light quantity of the laser light source 3 and (a).

In the present embodiment, light emission patterns of (j1) to (j4) are stored in the signal storage section 20, and the laser light source 3 is made to emit a light in such a way as to select arbitrary the light emission pattern stored in the signal storage section 20.

Further, the light receiving sensor 4, when the laser light source 3 emits a light, receives laser light from the laser light source 3 to come to the scan beam to output light receiving signal, followed by inputting the light receiving signal to the synchronizing signal generation means 7. The synchronizing signal generation means 7, when receiving the light receiving signal, generates synchronizing signal to execute operation control of the lighting control section 19. The lighting control section 19 causes the laser light source to emit a light with any pattern of (j1) to (j4) on the basis of the synchronizing signal generated from the synchronization signal generation means 7. Further, the control box 14 controls the mechanism control section 13 depending on the order of the instrumentation section CPU 18 to execute operation control of the pulse motor 12d to cause the feed screw 12c to be driven rotationally, further, the control box 14 causes the movable stage 11 to move in the X-direction, and causes the two-dimensional area light receiving sensor 8 to move in the X-direction.

On this occasion, the control box 14 executes operation control of the lighting control section 19 in such a way as to open and close the shutter 22 while synchronizing with the light emission pattern of the laser light source 3. For that reason, the control box 14 allows entrapment of the scan beam to be executed by the two-dimensional area light receiving sensor 8, followed by transmitting the obtained image data to the data storage section 10.

Further, on this occasion, the control box 14 transmits the position information of the imaging position acquired by the position detection section 16 from the storage section 17 to the instrumentation section CPU 18, and causes the instrumentation section CPU 18 to grasp whether the two-dimension area light receiving sensor 8 receives the scan beam at which position in the scan direction of the scan beam.

Also, in the present embodiment, signal of the laser light source 3 is capable of emitting a light in approximately the same condition as actual use of the scanning optical unit. For instance, here, approximately the same condition as actual use is that when scan beam speed in the photosensitive body image position R is taken to be 1000 m/sec, time required for 1 scanning period is taken to be 400 $\mu$sec, length of scanning is taken to be 350 mm, and writing density is taken to be comparable to 600 dpi, cycle Tc of 1 pixel is as follows:

$Tc=272\times10-6/(340\times600/25.4)=3.4\times10-8$ sec=34n sec

Also, when duty ratio in 1 clock is taken to be 50% (Ta=Tb), exposure time Ta is degree of:

$Ta=Tc/2=17$ nsec.

Also, at this time, since speed of the scan beam is 1000 m/sec, the scan beam moves during the exposure time, and approximate movement amount S is as follows:

$S1=3.4\times10-8\times1250\times103=4.2\times10-2$ mm=42 $\mu$m.

For that reason, in the measurement of dynamic beam, the light quantity distribution of the beam diameter spread in the scan direction, the beam diameter becomes large value of only amount corresponding to spread in the scan direction in comparison with one which is evaluated as only static beam.

Figure 3A:
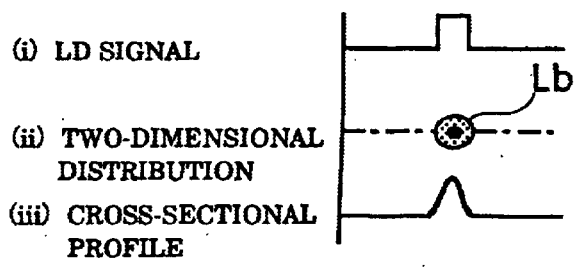
FIG. 3(a) shows an example of a 1-dot light emission pattern of laser light source according to the first embodiment.
Figure 3B:
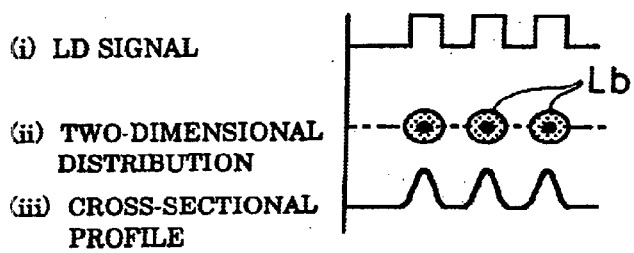
FIG. 3(b) shows a dot string light emission pattern of the laser light source according to the first embodiment.
Figure 4A:
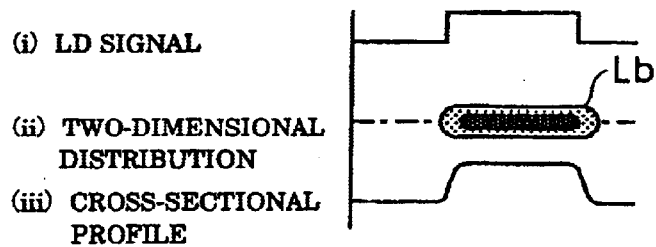
FIG. 4(a) shows an example of continuous light emission pattern of laser light source according to the first embodiment.
Figure 4B:
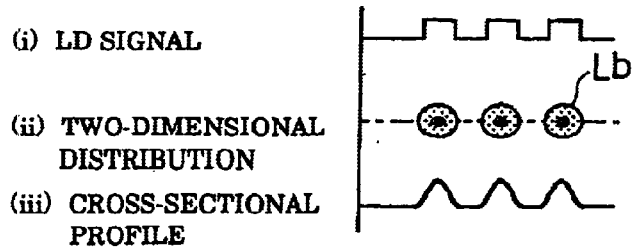
FIG. 4(b) shows a half-tone light emission pattern of the laser light source according to the first embodiment.

In FIG. 3 and FIG. 4, (i) indicates control LD signal of the light emission patterns of the laser light source 3 according to the lighting control section 19 of the scan beam of the present embodiment. In FIG. 3 and FIG. 4, (ii) indicates indication condition that the scan beam emitted a light with the pattern of (i) is made to receive by the two-dimensional area light receiving sensor 8 in such a way as to be described above, further, the instrumentation section CPU 18 calculates light quantity distribution of the scan beam on the basis of the image signal output from the two-dimensional area light receiving sensor 8, furthermore, the instrumentation section CPU 18 sends the image data on the basis of this calculation to the display section 23, then spot shaped light quantity distribution image Lb of the scan beam of the basis of the image data is made to indicate on image data is made to indicate on the display section 23. Also, (iii) of FIG. 3 and FIG. 4 indicates cross-sectional profile indication of the light quantity distribution when making the spot shaped light quantity distribution image Lb of (ii) cross section in the scan direction.

Also, when the scan beam in accordance with the scan beam light quantity measurement apparatus of the scan optical system of the present invention is projected onto the photosensitive body image position R, the scan beam is imaged on the light receiving sensor 8 through the objective lens 9. On this occasion, spot shaped scan beam is imaged on the light receiving surface of the two-dimensional area light receiving sensor 8 depending on the objective lens 9 as point image (spot image). In this case, the point image becomes in-focus on the light receiving surface of the two-dimensional area light receiving sensor 8 or becomes out-of-focus on the light receiving surface of the two dimensional area light receiving sensor 8 according to the position of the objective lens 9. The light quantity distribution of this case becomes as illustrated in FIG. 5(*a*), FIG. 5(*b*), FIG. 6(*a*), FIG. 6(*b*). FIG. 5 and FIG. 6 illustrate the light quantity distribution image Lb and its profile in cases where the point image exists on in-focus position to the focus depth direction or the point image exists on out-of-focus position to the focus depth direction. Moreover, FIG. 5 illustrates the light quantity distribution image Lb and its profile of the conventional static beam, and FIG. 6 illustrate the light quantity distribution image Lb and its profile according to the present embodiment.

FIG. 5(*a*) illustrates the case that the point image of the scan beam exists on in-focus position at the conventional beam diameter evaluation, FIG. 5(*b*) illustrates image data in out-of-focus position and cross-sectional profile at the scanning line. In this FIG. 5, peak light quantity P1*a* of FIG. 5(*a*) differs largely from peak light quantity P1*b*. Also, when obtaining beam diameter from the cross-sectional profile of the light quantity distribution image Lb, the beam diameter is obtained on the basis of ratio to peak value (peak light quantity) of intensity distribution, for instance, it is determined that the beam diameter is obtained on the basis of 1/e2≠13.5% of the peak value (peak light quantity) of the intensity distribution. According to this matter, the beam diameters obtained from the light quantity distribution image Lb and its cross-sectional profile of FIG. 5(*a*) and FIG. 5(*b*) become respective B1*a*, B1*b*. In the case of FIG. 5, the beam diameter B1*b* of the out-of-focus position is slightly larger than the beam diameter B1*a* of the in-focus position.

FIG. 6 illustrates measurement result of beam diameter depending on the measurement apparatus 1 of the present embodiment. In the present embodiment, since dynamic measurement is executed, distribution width is spread in comparison with FIG. 5. Here, on the occasion of evaluation of the beam diameter, the same light quantity threshold value is applied to the light quantity distribution image Lb and its cross-sectional profile of FIG. 5(*a*) and FIG. 5(*b*), with the result that in FIG. 5(*a*), beam diameter becomes B2*a*, and in FIG. 5(*b*), beam diameter becomes B2*b*, thus the beam diameter B2*a* of in-focus position becomes considerably larger than the beam diameter B2*b* of out-of-focus position.

For instance, it is ideal that the light quantity threshold value is determined in such a way as to match sensitivity of the photosensitive body. Accordingly in the present embodiment, the light quantity threshold value is set to be equivalent to a light quantity whereby toner is capable of being transferred normally onto the photosensitive body when the scan beam is irradiated on the photosensitive body surface.

For that reason, evaluation of the beam diameter on the basis of dynamic measurement of the present embodiment indicates that the evaluation close to actual image formation is capable of being executed in comparison with the evaluation of the beam diameter in the static beam. Since when preliminary image formation is executed actually using the optical unit, exposure is made at the out-of-focus position, thus the preliminary image formation revealed that the light quantity for exposure is lacking, malfunction occurs on the image formation. According to this result, it is known from the fact that evaluation to the optical unit in accordance with the measurement apparatus 1 of the present embodiment is executed accurately.

Figure 7A:
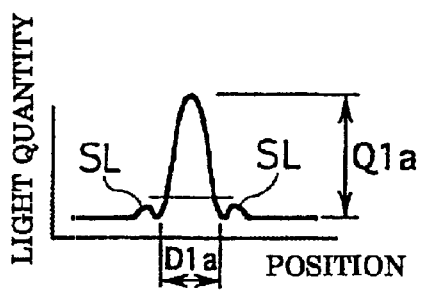
FIG. 7(a) shows a beam diameter of a static scan beam where a small-size side lobe is generated.
Figure 7B:
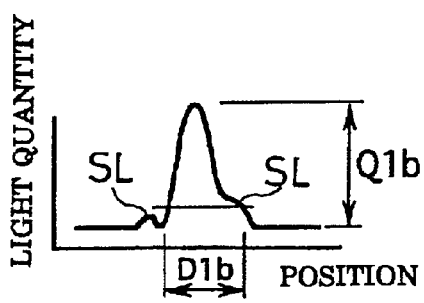
FIG. 7(b) shows a beam diameter of a static scan beam where a large-size side lobe is generated.

FIG. 7(*a*) and FIG. 7(*b*) illustrate examples in which when measuring beam diameter according to the static beam while using the scan beam light quantity measurement apparatus of the scan optical system of the present embodiment, side lobes SL occur on the scan beam. FIG. 7(*a*) illustrates measurement example of the beam diameter whose size of the side lobe is small, and FIG. 7(*b*) illustrates measurement example of the beam diameter whose size of the side lobe is large.

FIG. 7 illustrates conventional evaluation example of the beam diameter namely, measurement example of the beam diameter. Further, FIG. 7(*a*) illustrates image data and cross-sectional profile at the scanning line in cases where the side lobe SL that occurs caused by optical maladjustment of the optical unit is small. FIG. 7(*b*) illustrates image data and cross-sectional profile at the scanning line in cases where the side lobe SL that occurs caused by optical maladjustment of the optical unit is large. Peak light quantity Q1*a* in the cross-sectional profile of this FIG. 7(*a*) is nearly the same as peak light quantity Q2*a* in the cross-sectional profile of this FIG. 7(*b*). However, when finding the beam diameter depending on conventional method (1/e2≅13.5%), in FIG. 7(*a*), the beam diameter to be found becomes D1*a*, while in FIG. 7(*b*), the beam diameter to be found becomes D1*b*, as a result, value of the beam diameter D1*b* of FIG. 7(*b*) is considerably larger than value of the beam diameter D1*a* of FIG. 7(*a*).

Figure 8A:
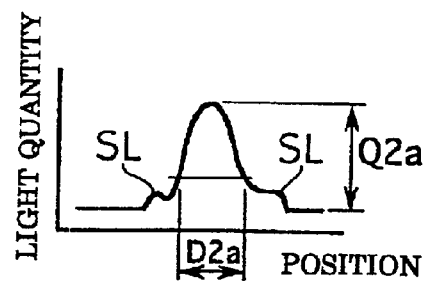
FIG. 8(a) shows a beam diameter of a dynamic scan beam where a small-size side lobe is generated.
Figure 8B:
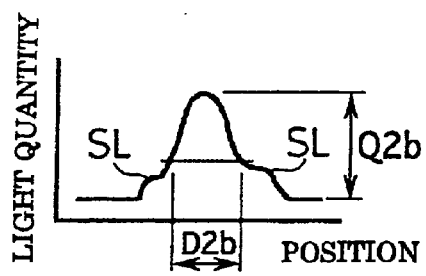
FIG. 8(b) shows a beam diameter of a dynamic scan beam where a large-size side lobe is generated.

FIG. 8 illustrates measurement example of the beam diameter in accordance with the measurement apparatus 1 of the present embodiment. Since dynamic measurement is executed in this FIG. 8, distribution width of light quantity of the beam diameter is spread in comparison with FIG. 7. Here, on the occasion of evaluation of beam diameter, namely measurement of the beam diameter, when applying the same light quantity threshold value as FIG. 7 to the cross-sectional profile of FIG. 8, the beam diameter in cases where the side lobe SL is small (FIG. 8(*a*)) becomes D2*a*, while the beam diameter in cases where the side lobe SL is large (FIG. 8(*b*)) becomes D2*b*, and value of the beam diameter D2*a* is approximately the same as value of the beam diameter D2*b*. Also, in this case, it is ideal that the light quantity threshold value should correspond to the sensitivity of the photosensitive body. Actually, when executing preliminary image formation using this optical unit, image formation malfunction does not occur. Also, in this case, it is known that evaluation of the optical unit is executed accurately.

Thus, in the present embodiment, there is provided the two-dimensional area light receiving sensor 8 that is capable of moving in the same direction as the scan direction of the scan beam. The two-dimensional area light receiving sensor 8 detects the scan beam while moving in the scan direction of the scan beam. Then the operation is made to relate the scan beam received by the light receiving sensor 8 to position information for storing in the data storage section 10. This is followed by analyzing the light quantity distribution of the scan beam that is scanned in the X-direction while using data of the scan beam stored in the data storage section 10. Therefore, it is possible to measure the dynamic light quantity distribution of the scan beam scanned in the entire scanning area of scan optical system 2.

Further, it is possible to measure the light quantity corresponding to 1 pixel at an arbitrary position in the entire scanning area under approximately a condition equivalent (i.e., setting of exposure time and so forth) to actual use. Also on the basis of the light quantity distribution, it is possible to determine an accurate position of an abnormal section of profile irregularities (undulation), surface defect, internal defect and so forth of the optical element within the scan optical system that would cause faulty image formation.

Also, when the light quantity distribution of the scan beam is analyzed, the beam diameter is measured and the light quantity threshold value is set to be equivalent to a light quantity where toner is transferred normally onto the surface of the photosensitive body. Therefore, it is possible to measure the scan beam with the light quantity in accordance with the light intensity that forms electrostatic latent image on the photosensitive body. Accordingly, it is possible to execute evaluation in conformity with actual state to the scanning Further, the lighting control section 19 has a configuration (a) the laser light source is made to execute lighting by only 1 point (1 time) during one scanning period of the laser light, (b) the laser light source 3 is made to execute a plurality of lightings at a constant time, (c) the laser light source 3 is made to emit continuously, or (d) the laser light source 3 is made to emit at constant time intervals. The lighting timing (lighting position in the X-direction at straight line shaped photosensitive body image position R) at the time of lighting of the laser light source 3, and selection of the light quantity of the laser light (scan beam) are preset and stored therein, and the lighting control section 19 allows light emission to be executed in accordance with the stored light emission patterns. For that reason, it is possible to execute the light quantity distribution measurement in accordance with the light emission pattern in such a way as to select the light emission pattern within one scanning period of the scan beam 1. Accordingly, it is possible to perform various evaluations of the scan optical system unit.

For instance, as to setting of light quantity of light emission of the laser light source 3, there are a case of full light quantity and a case of halftone. In the case of the halftone, since the light quantity of the scan beam is halved, it is possible to evaluate with high sensitivity a slight abnormality of the optical element. When using continuous light, it is possible to detect local drop of the light quantity in the entire area of the scan optical system.

Further, in the present embodiment, since movement position of the two-dimensional area light receiving sensor 8 is continuously detected, even though image data is acquired with the two-dimensional area light receiving sensor 8 moved, it is possible to reduce considerably measurement time without deterioration of measurement accuracy.

Furthermore, when the scan beam is detected by the light receiving sensor 4, the synchronization signal generation means 7 generates scanning synchronizing signal on the basis of this detected signal. Then, the lighting control section 19 receives this scanning synchronizing signal and emits the laser light source 3 during only one scanning period in accordance with selected light emission pattern while synchronizing with this signal. As a result, it is possible to scan the scan beam of required pattern at an arbitrary position in the scan optical system. For that reason, it is possible to analyze in detail characteristics of specified portion of the scan optical system 2.

Moreover, since the lighting control section 19 allows the scan beam to be scanned in a condition approximately equal condition to actual use, it is possible to evaluate the light quantity distribution of the scan optical system unit under conditions approximately equal to actual use of the scan beam.

Further, when the light receiving sensor 8 detects the scan beam, the synchronizing signal generation means 7 generates scanning synchronizing signal on the basis of this detected signal. Then, the two-dimensional area light receiving sensor 8 is capable of selecting the scan beam to be measured since the light receiving surface is capable of being opened and closed by the shutter 22 so as to select to be entrapped the number of required scanning lines while synchronizing with this scanning synchronizing signal.

Further, since the two-dimensional area light receiving sensor 8 outputs stored charges as the image signal to the data storage section 10, and possesses function for removing stored charges after outputting to the data storage section 10, thus making it possible to detect again, accordingly, high speed measurements are possible.

Furthermore, since the two-dimensional area light receiving sensor (two-dimensional area type light receiving element) 8 is capable of enlarging the spot image to be detected by the objective lens 9, it is possible to enhance resolution of the two-dimensional area light receiving element 8. Thus it is possible to improve measurement accuracy of the light quantity distribution.

Moreover, the lighting control section 19 entraps the scanning synchronizing signal from the synchronizing signal generation means 7 as the light receiving sensor 4 receives the scan beam. Then the laser light source 3 is emitted while matching the timing of acquisition of the signal, thereby allowing the scanning to be started with the scan beam synchronized with acquired timing of the scanning synchronizing signal. As a result, it is possible to evaluate the measurement of the beam diameter in such a way as to execute signal processing of the scanning light quantity distribution data.

Thus, the beam diameter and peak light quantity are measured in accordance with a light quantity threshold value suitable for sensitivity of the photosensitive body. Thereby, it is possible to detect these abnormal values and to specify an abnormality of profile irregularities (undulation), surface defect, internal defect and so forth of the optical element within the scan optical system that contribute occurrence of faulty condition on the image formation.

Further, the light receiving sensor 4 outputs detected signal when receiving the scan beam, before inputting the detected signal to the synchronization signal generation means 7. Then, the synchronization signal generation means 7 generates the scanning synchronization signal when receiving the detected signal. Subsequently, the control box 14 causes operation control of the lighting control section 19 to make it possible to execute incidence of the laser light onto the specific mirror surface of the polygon mirror 5 in connection with the laser light from the laser light source 3 in such a way as to count the scanning synchronization signal. Thus, the lighting control section 19 executes light emission control of the laser light source 3, thereby, the lighting control section 19 enables the laser light source 3 to emit a light in such a way as to make it possible to scan the laser light in connection with specific surface of the polygon mirror 5. Thus, the operation is made to execute about the scan beam so as to scan by use of specific mirror surface of the polygon mirror 5. Thereby, it is possible to increase the dot position repeatability of the scan beam that is scanned repeatedly for the sake of evaluation without receiving effect of performance variation of the polygon mirror surface. According to this operation, the two-dimensional area light receiving sensor 8 is made to move in the X-direction to change imaging position, and the two-dimensional area light receiving sensor 8 is made to receive the scan beam every time the imaging position is changed. Thus it is possible to accurately detect the light quantity distribution across the entire scanning area in such a way as to execute connection processing of the imaged image data after repeated acquisition of the image data.

In the present embodiment, measurement method of the present invention is applied to the measurement apparatus 1 for detecting the light quantity. However the present invention is not necessarily to be limited to this configuration. For instance, in the image formation apparatus, it is possible to use it while being combined with assembly adjustment apparatus that executes assembly adjustment of parts used within the image formation apparatus while ascertaining the light quantity distribution of the beam.

FIG. 9 to FIG. 13 are views illustrating second embodiment of a scan beam light quantity distribution measurement method and measurement apparatus of scan optical system according to the present invention, and in the present embodiment, the same number is added to the same configuration as that of the first embodiment to omit explanation.

In the present embodiment, the lighting control section 19 is made to execute lighting control of the laser light source 3 with constant intervals so as to modulate the scan beam emitted from the laser light source 3 with a pixel unit, and the two-dimensional area light receiving sensor 8 receives the scan beam at the photosensitive body image position R, then the control box 14 analyzes the light quantity distribution of the scan beam received by the two-dimensional area light receiving sensor 8. At the time that the light quantity distribution of the scan beam analyzed, distance between dot positions of adjacent two points is set in such a way as to calculate dot center of gravity position of the respective scan beams from the light quantity distribution data thus analyzed to a plurality of dots measured within the scanning area of the scan beam. Thus, magnification error and bend of the scanning line are made to find from data of the horizontal scan direction of the scan beam obtained in such a way as to find repeatedly the distance between dot positions in every adjacent two dots. This is the characteristic of the present embodiment.

For that reason, in the present embodiment, an order is sent from the instrumentation section CPU 18 to the lighting control section 19 through the control box 14 to execute operation control of the lighting control section 19 so that the instrumentation section CPU 18 allows modulation signal to be output from the lighting control section 19 while matching the clock of the clock signal generation means 21. Moreover, the instrumentation section CPU 18 allows the scan beam to be scanned with the same frequency as actual use in such a way as to enable laser light source LD 12 to be driven in accordance with the modulation signal output from the lighting control section 19.

Further, the instrumentation section CPU 18 allows the time interval of the dot ON/OFF (ON/OFF of the laser light source 3) of the scan beam to be stored in the signal storage section 20 of the lighting control section 19 beforehand, and allows the clock signal to be generated from the clock signal generation means 21 on the basis of data stored in the signal storage section 20, and allows the laser light source 3 to be synchronized with the clock signal through the lighting control section 19 to execute ON/OFF control in such a way as to execute operation control of the lighting control section 19 in synchronization with the clock signal. Timing of light emission of the scan beam will be described later.

Figure 9:
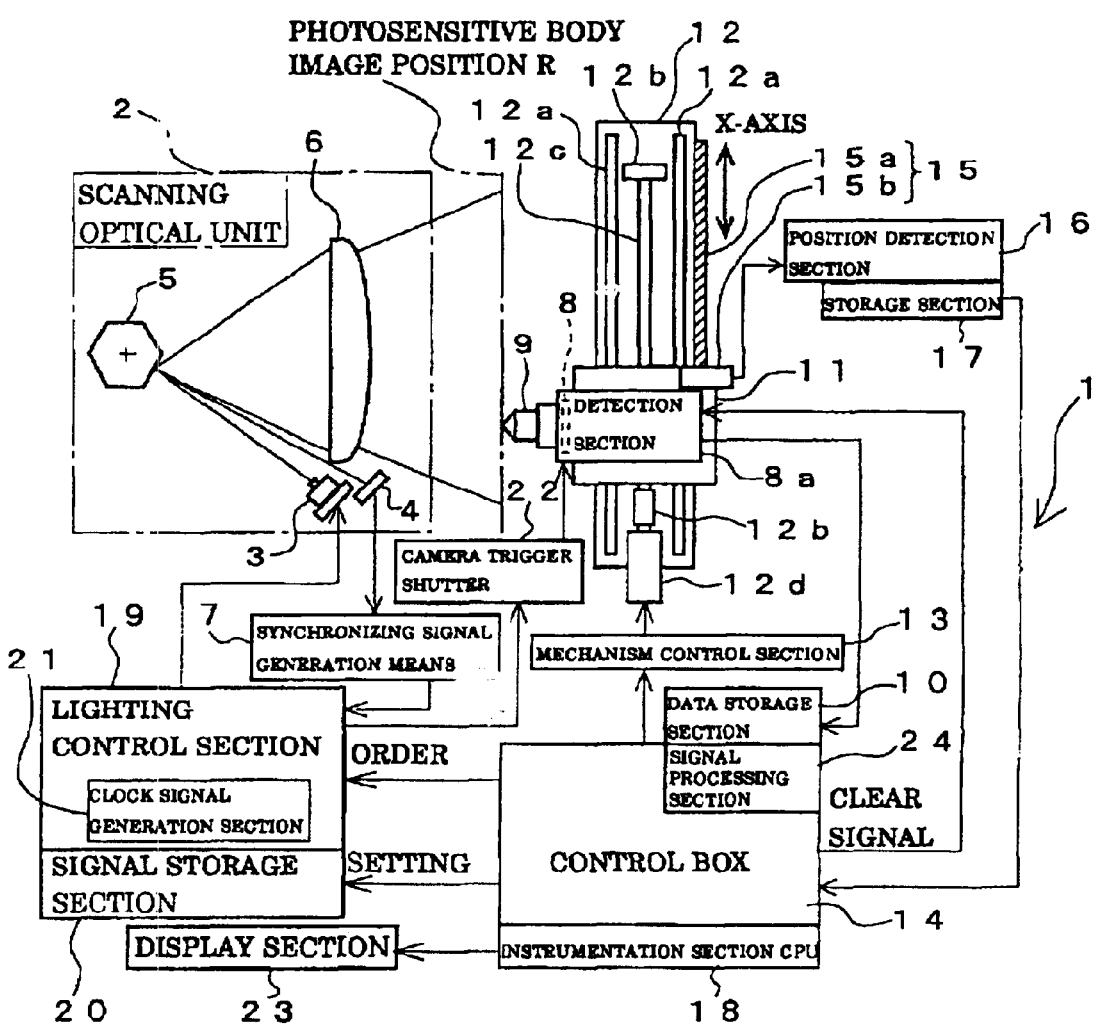
FIG. 9 illustrates a scan beam light quantity distribution measurement method and measurement apparatus for use in a scan optical system according to a second embodiment of the present invention.

Furthermore, the present embodiment has a different point from the first embodiment of the present invention in that, as illustrated in FIG. 9, position detection sensor (photo diode for position detection trigger) 31 is mounted on the X-direction movable stage 11 while allowing the position detection sensor 31 to be made adjacent to the two-dimensional area light receiving sensor 8. Moreover, when the two-dimensional area light receiving sensor 8 images the scan beam, the instrumentation section CPU 18 transmits the image data acquired by the two-dimensional area light receiving sensor 8 to the data storage section 10 through the control box 14. Further, the control box 14 converts the scan beam received by the position detection sensor 31 into trigger at the same time of transmission of the image data, and transmits the position information of the imaging position detected by the position detection section 16 from the storage section 17 to the instrumentation section CPU 18.

Thus, it is possible to know incidence timing of the scan beam into the two-dimensional area light receiving sensor 8 in such a way as to allow the scan beam to be detected by the position detection sensor 31. Accordingly, it is possible to know position of the two-dimensional area light receiving sensor 8 in such a way as to allow the scan beam to be detected by the two-dimensional area light receiving sensor 8 in such a way as to use detected signal of the scan beam from the position detection sensor 31 as the trigger of position information acquisition.

Next, operations of the scan beam light quantity distribution measurement apparatus of the scan optical system such a configuration will be described.

Figure 10:
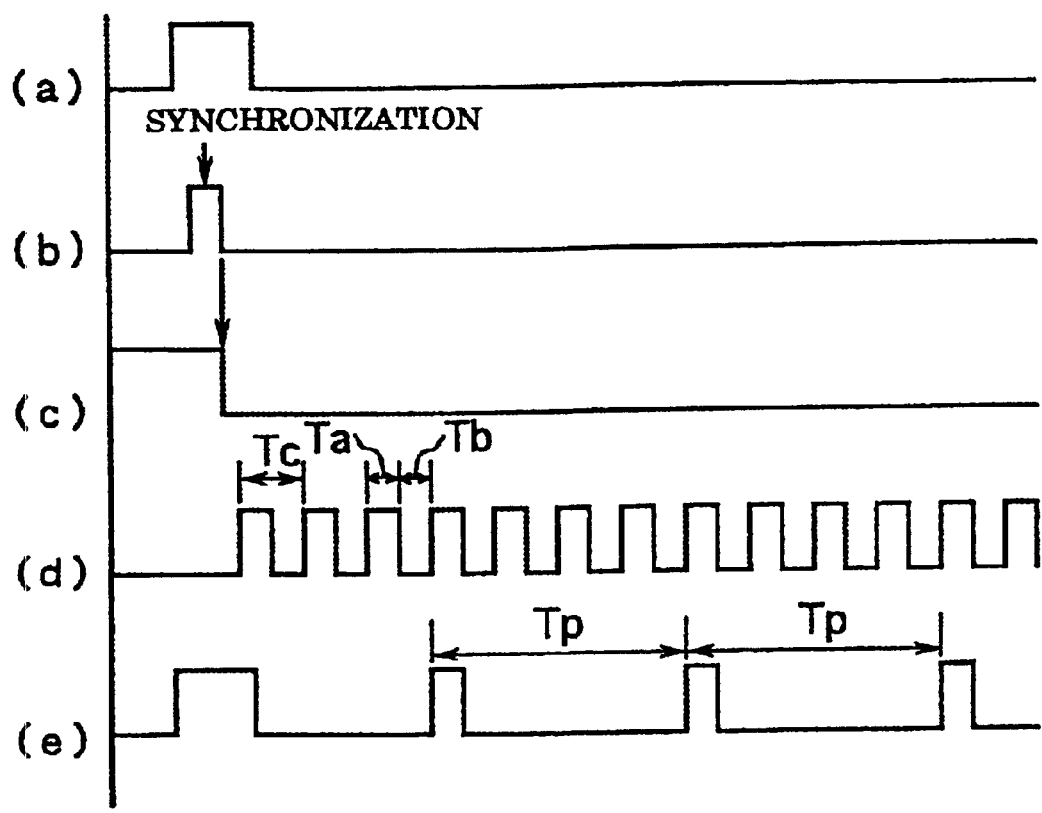
FIG. 10 is a timing chart of a signal generation control section of a scan beam pattern according to the second embodiment.

FIG. 10 illustrates timing chart in the lighting control section 19 of the scan beam of the present embodiment.

In FIG. 10, (a) is a fundamental signal of the laser light source 3. The fundamental signal is one in which the laser light source 3 is made to emit a light at predetermined time intervals in order to obtain synchronizing signals for indicating a scanning start position of the scan beam.

In FIG. 10, (b) is a trigger signal on the basis of the detected signal of the light receiving sensor 4, and the trigger signal causes the synchronizing signal for indicating scanning start position to be output from the synchronizing signal generation means 7.

In FIG. 10, (c) is a signal that causes Low-signal to be output from the synchronizing signal generation means 7 as the synchronizing signal to turn into scanning start position at the time point of the falling of the trigger signal of (b) to keep to Low level.

In FIG. 10, (d) is a clock signal generated by the clock signal generation means 21, and phase of the clock signal generated by the clock signal generation means 21 is adjusted to timing that signal of (c) turns into Low, the clock signal has the same frequency as that of the actual use.

In FIG. 10, (e) is drive signal for driving actually the laser light source 3 on the basis of a program of the instrumentation section CPU 18. The drive signal of this (e) is output while counting the clock signal of (d). For instance, in FIG. 10, the drive signal of (e) sets time interval Tp of the value that is subjected to 4-pulse-count of the clock signal as quad counter.

The time interval Tp is capable of being set arbitrary, and it is possible to be taken as a time interval for emitting light about the dot.

Here, the clock signal of (d) is matched accurately to the synchronizing signal of (c) generated from the synchronizing signal generation means 7 in connection with its timing. Thereby, when outputting drive signal (light emission control signal) of the laser light source 3 in every time interval Tp using the clock signal, the laser light emitted from the laser light source 3 is scanned by the polygon mirror 5 so as be projected onto the photosensitive body image position R. Thus it is possible to improve considerably the repeatability of the position in the X-direction to which the dot (point image) is imaged onto the straight line shaped photosensitive body image position R.

Thus, the drive signal of the laser light source 3 is capable of emitting light at the same condition as the actual use of the scanning optical unit. For instance, at the photosensitive body image position R, when scan beam speed is taken to be 1250 m/sec, time required for 1 scanning period is taken to be 400 μsec, scanning length is taken to be 340 mm, and writing density is taken to be corresponding 600 dpi, cycle Tc of 1 pixel is as follows:

$Tc=272\times10-6/(340\times600/25.4)=3.4\times10-8$ sec=34 n sec.

Further, when duty ratio per 1 clock is taken to be 50% (Ta=Tb), exposure time is:

$Ta=Tc/2=17$ n sec.

Furthermore, since the scan beam speed is 1250 m/sec at this time, interval S1 of dots of the scan beam is:

$S1\times3.4\times10-8\times1250\times103=4.2\times10-2$ mm=42 μm.

If it is set that Tp=Tc=34 n sec, it is possible to emit a light of 1/34 (nsec)=29.4 MHz. For that reason, it is possible to measure magnification error and/or bend amount of the scanning line at micro area of the scan beam as illustrated in FIG. 11, FIG. 12.

Figure 13:
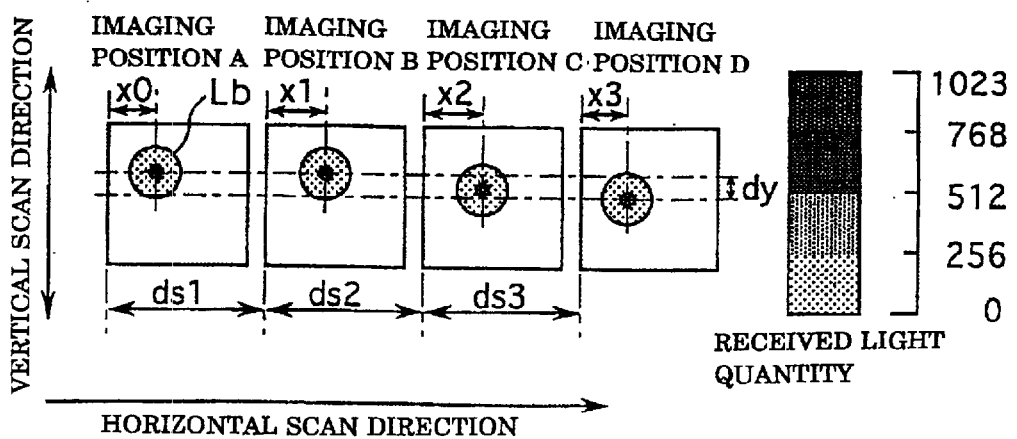
FIG. 13 shows image data when measuring evaluation of magnification error and scanning line bend quantity in the entire scanning area of a scan optical system are executed by use of dot line for lighting with accurate time interval according to the second embodiment.

Further, if Tp=0.8 μsec is set, dot interval S2 of the scan beam becomes as follows:

$S2=0.8$ μsec$\times1250$ m/sec=1 mm and it is possible to execute measurement evaluation of linearity of 1 mm interval of scan beam and/or bend amount of the scanning line as illustrated in FIG. 13.

Figure 11:
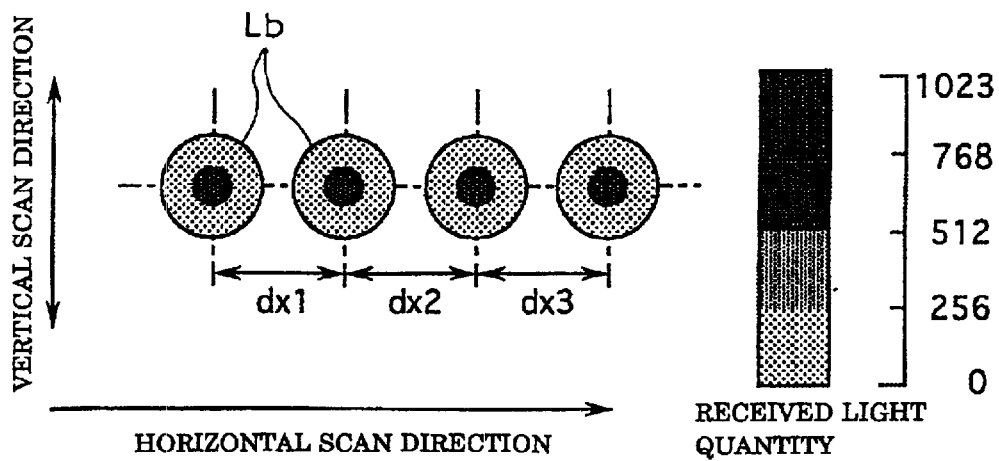
FIG. 11 shows image data when magnification error is evaluated at a micro area of a scan optical system by using dot line lighting with accurate time interval according to the second embodiment.
Figure 12:
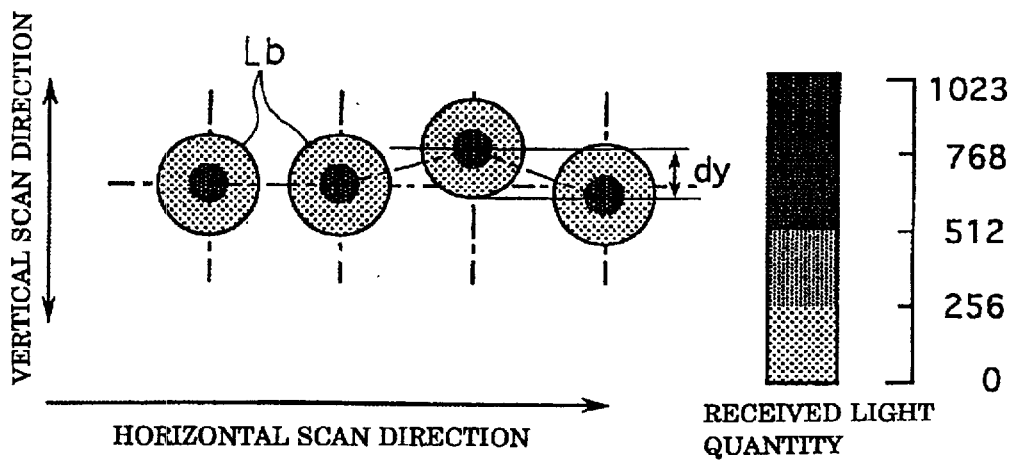
FIG. 12 shows image data when a scan line bending amount of a scan optical system is evaluated at micro area of a scan optical system by using dot line lighting with accurate time interval according to the second embodiment.

FIG. 11 is a view illustrating the light quantity distribution image Lb of the scan beam obtained depending on modulation control of the laser light source 3 of the present embodiment in order to evaluate magnification error at the micro area of the scan optical system.

Namely, in FIG. 11, the lighting control section 19 allows the laser light source 3 to execute the lighting control with the accurate time interval, and allows the laser light from the laser light source 3 to be scanned by the polygon mirror 5, thereby, allowing dot line (spot light line) emitted by the laser light source 3 to be imaged onto the photosensitive body image position R. Then the two-dimensional area light receiving sensor 8 acquires the laser light from the laser light source 3 at the photosensitive body image position R, and image data is created. Thus, the line (dot line) of the light quantity distribution image Lb is displayed. In FIG. 11, it is possible to measure the magnification error of the scan optical system 2 in such a way as to find intervals dx1, dx2, dx3, . . . of the line of the light quantity distribution image Lb.

Thus, the two-dimensional area light receiving sensor 8 receives dots of laser light emitted from the laser light source 3 with the accurate time interval. Then center of gravity positions of respective dots of the laser light received by the two dimensional area light receiving sensor 8 are made to calculate respectively from the image data of the light quantity distribution image Lb. Subsequently, it is possible to evaluate the magnification error at micro area of the scan optical system in such a way as to measure intervals dx1, dx2, dx3, . . . of the line of the light quantity distribution image Lb.

The present embodiment is the case that a plurality of dots (spot light line of the laser light from the laser light source at the photosensitive body image position R) are entrapped within the same imaging area. The dot interval, in the case of minimum, is capable of setting to interval of writing density.

Further, with respect to detection position, measurement is made to execute on the entire scanning area in such a way as to move the X-direction movable stage 11 in the X-direction while moving the two-dimensional area light receiving sensor 8 in the scan direction (X-direction).

FIG. 12 illustrates an example of a line of the light quantity distribution image Lb obtained in the same way as FIG. 11 in order to execute measurement evaluation of the scanning line bend-amount of the scan optical system 2.

Namely, in FIG. 12, the lighting control section 19 allows the laser light source 3 to be executed lighting control with the accurate time interval, and allows the laser light of the laser light source 3 to be scanned by the polygon mirror 5. Thereby the dot line (spot light line) of the laser light due to light emission of the laser light source 3 are imaged onto the photosensitive body image position R. Then the two-dimensional area light receiving sensor 8 acquires the laser light from the laser light source 3 at the photosensitive body image position R, and the operation is made to find the image data on the basis of the image signal output from the two-dimensional area light receiving sensor 8, then it allows the line (dot line) of the light quantity distribution image Lb to be indicated from the image data. In this FIG. 12, the center of gravity positions of respective dots of the laser light received by the two-dimensional area light receiving sensor 8 are calculated. Also the maximum difference dy of variation in the vertical scan direction of the line of this light quantity distribution image Lb is measured. Thus it is possible to evaluate the scanning line bend-amount on the micro area of the scan optical system 2.

In the present embodiment, the case that a plurality of dots are entrapped within the same imaging range is indicated. The dot interval is capable of being set to interval of the writing density in the minimum case.

Further, concerning the detection position, measurement is made to execute on the entire scanning area in such a way as to move the X-direction movable stage 11 in the X-direction while moving the two-dimensional area light receiving sensor 8 in the scan direction (X-direction).

FIG. 13 is a view illustrating an example in which the magnification error and the scanning line bend-amount are measured.

Also, the example of the light quantity distribution image Lb of this FIG. 13 is obtained in such a way that, in the same way as FIG. 11, FIG. 12. The laser light source 3 is controlled with the accurate time interval so as to scan the laser light from laser light source 3 by the polygon mirror 5. Then the two-dimensional area light receiving sensor 8 receives light (image taking) of the laser light (scan beam) thus scanned. In this case, the dot interval is separated in such a way that one dot falls within the imaging range of the two-dimensional area light receiving sensor 8. Subsequently, the two-dimensional area light receiving sensor 8 is moved in the X-direction by predetermined pitch ds to image the scan beam that is emitted under the same condition as above. This is repeated about imaging positions A, B, C, D, . . . , in order to obtain the image data across the entire scanning area.

The two-dimensional area light receiving sensor 8 sequentially by the X-direction movable stage 11. The two-dimensional area light receiving sensor 8 at a uniform velocity by the X-direction movable stage 11 for continuous measurement.

The control box 14 calculates the center of gravity of the dot on the basis of data obtained by the two-dimensional area light receiving sensor 8 to obtain coordinates X0, X1, X2, X3, . . . of the horizontal scan direction of the two-dimensional area light receiving sensor 8.

Dot interval dp1 between imaging positions A and B is dp1=ds1+X1−X0.

Dot interval dp2 between imaging positions B and C is dp2=ds2+X2−X1.

Dot interval dp3 between imaging positions C and D is dp3=ds3+X3−X2.

Hereinafter, in the same way as above, it is possible to execute measurement of the magnification error in the entire scanning area while calculating respective dot intervals dp.

At this time, values of pitches ds1, ds2, ds3, . . . , of the line of the light quantity distribution image Lb are capable of being found of the position information of movement position data, movement amount data, and so forth output from the position detection section 16.

Further, the scanning line bend-amount on the entire scanning area is capable of being measured in such a way as to calculate dy that is the maximum difference of variation from the center of gravity position of the dot (light quantity distribution image Lb) of the vertical scan direction).

Thus, in the present embodiment, the lighting control section 19 controls the laser light source 3 with constant intervals so as to modulate the scan beam emitted from the laser light source 3 with a pixel unit, and converts the laser light into the scan beam while scanning by the polygon mirror (light scanning means) 5. Then the two-dimensional area light receiving sensor 8 receives the scan beam at the photosensitive body image position R to analyze the light quantity distribution of the scan beam received by the two-dimensional area light receiving sensor 8. At the time that the light quantity distribution of the scan beam is being analyzed, the distance between dot positions of adjacent two points is found so as to calculate dot center of gravity position of the respective scan beams from the light quantity distribution data thus analyzed. Thus, magnification error of the scan optical system 2 is found from the data so as to repeatedly find the distance between dot positions in every adjacent two dots. The amount of bend of the scanning line of the scan optical system 2 is found from the data of the vertical scan direction of the scan beam. Thereby, it is possible to measure the magnification error and the scanning line bend-amount of the scan optical system with high accuracy. For that reason, it is possible to identify any abnormality including profile irregularities (undulation), surface defect, internal defect and so forth of the optical element.

Further, since the data stored in the data storage section is butted together in the horizontal scan direction, it is possible to detect an absolute position of the scan beam on the basis of the position of the two-dimensional area light receiving sensor 8 thus obtained and the coordinate on the image without increasing absolute positioning accuracy of the movement mechanism. Thus, it is possible to measure accurately the magnification error or the scanning line bend-amount on the entire scanning area of the scan optical system.

Further, since the position detection section 16 always detects movement position of the two-dimensional area light receiving sensor 8, even though the image data is made to obtain with the two-dimensional area light receiving sensor 8 moved, measurement accuracy does not deteriorate. Thus it is possible to reduce measurement time considerably.

Furthermore, selection of specific mirror surface from a plurality of mirror surfaces of the polygon mirror 5 is such that scanning synchronizing signal from the light receiving sensor 4 are counted and the lighting control section 19 controls the laser light source 3 using this count value. Thus, it is possible to enhance dot position repeatability of the scan beam without receiving undue influence of performance variation of a plurality of mirror surfaces of the polygon mirror 5. Moreover, it is possible to accurately detect magnification error and scanning line bend-amount across the entire scanning area.

Moreover, since there is provided a position detection sensor 31 for detecting incidence timing of the scan beam to the two-dimensional area light receiving sensor 8, and position information from the position detection section 16 is obtained as this position detection sensor 31 detects the scan beam, it is possible to acquire the position information in the horizontal scan direction of the two-dimensional area light receiving sensor 8. For that reason, the position detection section 16 is capable of eliminating acquisition error of the position information accompanied by movement of the two-dimensional area light receiving sensor 8. As a result, it is possible to accurately acquire position information acquisition when receiving the imaging data when the two-dimensional area light receiving sensor 8 is moved.

Figure 14:
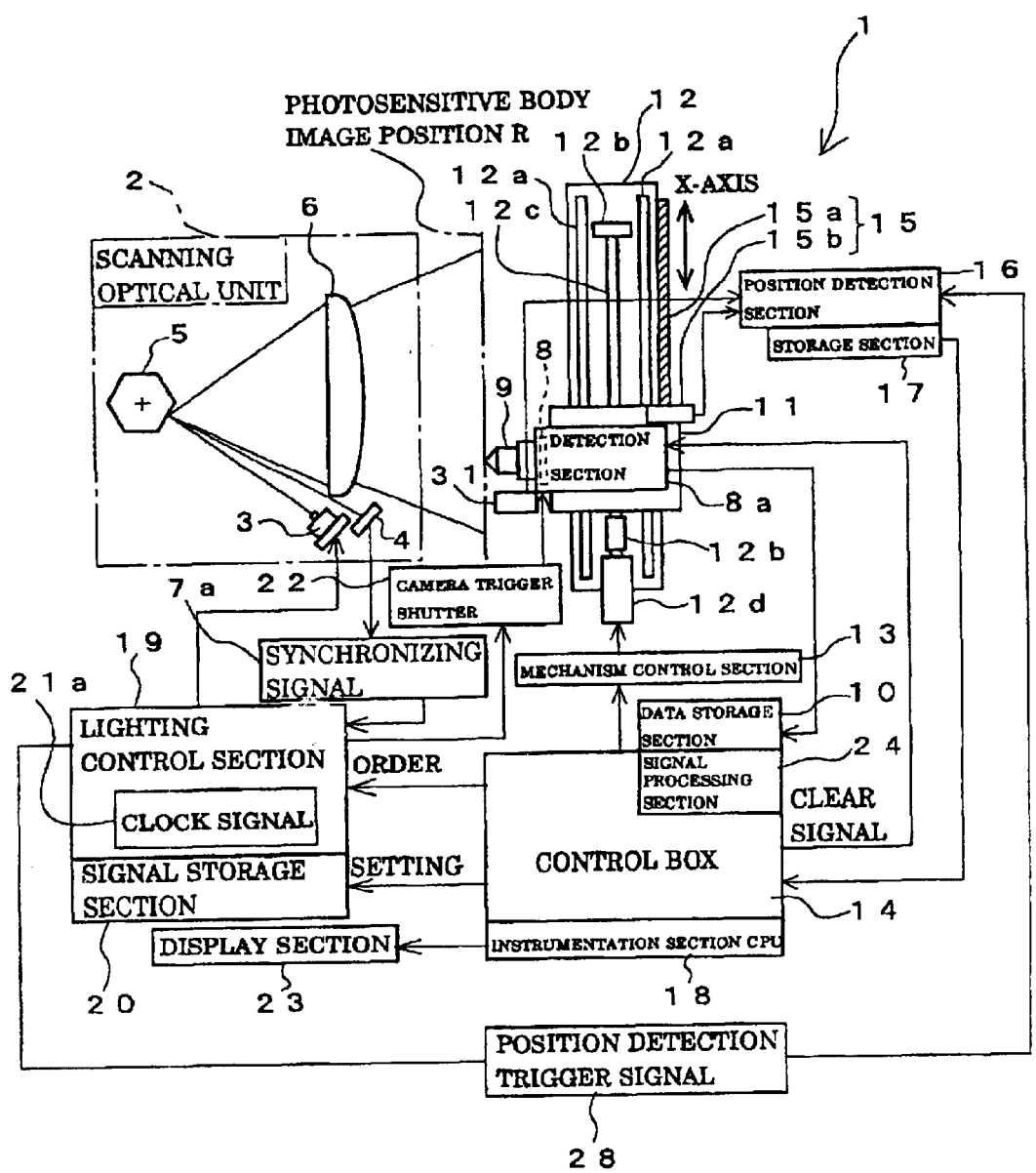
FIG. 14 is a block diagram of a scan beam measurement evaluation apparatus of one embodiment of the invention.

FIG. 14 is a block diagram illustrating third embodiment of the scan beam light quantity distribution measurement apparatus used in an electrophotographic image formation apparatus.

Scan beam light quantity distribution measurement apparatus 1 execute measurement while setting to the scan optical system 2. Moreover, in the present embodiment, a light receiving sensor is used for detecting scan beam scanning start position as a reference position detection means. A reference position signal of this sensor hereinafter is called a synchronization signal.

The scanning optical unit 2 has the laser light source 3 and the light receiving sensor 4. A laser diode (hereinafter referred to as LD) is used for the laser light source 3, and photo diode (hereinafter referred to as PD) for detecting scanning start position of the scan beam is used for the light receiving sensor 4. Further, the laser light source 3 and the light receiving sensor 4 are capable of being connected to the scan beam light quantity distribution measurement apparatus 1 in such a way as to be capable of inputting and outputting thereto by use of connector. Furthermore, signal input and output for the polygon mirror 5 that is rotational multiple mirror is capable of being connected by use of connector.

According to the configuration, the scan beam light quantity distribution measurement apparatus 1 irradiates the light beam from the laser light source 3 directed to reflection surface (mirror surface) of the polygon mirror 5 that is rotated, and the scan beam light quantity distribution measurement apparatus 1 allows the light beam to be reflected by the reflection surface (mirror surface) of the polygon mirror 5. Thus it is possible to scan the light beam from the laser light source 3. At the time of this scanning, the scan beam (light beam) that is emitted from the laser light source 3 and scanned by the polygon mirror 5 is irradiated to the light receiving sensor 4 to be received by the light receiving sensor 4. The light receiving sensor 4, when receiving the scan beam, is capable of obtaining synchronizing signal 7a that becomes the scan beam scanning start position.

Subsequently, the light beam becomes a scan beam scanning the polygon mirror 5. Then the scan beam focuses onto the photosensitive body image position R through the fθ-lens 6 to image on the straight line.

The scan beam light quantity distribution measurement apparatus 1 has the two-dimensional area light receiving sensor 8 made up of CCD as detection means. The two-dimensional area light receiving sensor 8 is capable of receiving the scan beam that is imaged onto the photosensitive body image position R due to the scanning optical unit 2. Further, spot light of the scan beam imaged onto the photosensitive body image position R due to the scanning optical unit 2 is enlarged by the objective lens 9. The objective lens 9 is provided at the case 8a of the two-dimensional area light receiving sensor 8 and is installed and removed freely.

Further, subtle position deviation in the light axis direction that is produced at the time of installation and removal of the objective lens 9 to the case 8a is adjusted by fine adjustment of the Y-direction movable table (Y-direction movable stage) 12 in the light axis direction of the objective lens 9. This point is the same as that of the first embodiment of the present invention.

The scan beam light quantity distribution measurement apparatus 1 takes a timing of light emission of the laser light (light becomes scan beam) due to the lighting control section 19 on the basis of the synchronizing signal 7a obtained depending on the light receiving sensor 4. Further, the scan beam light quantity distribution measurement apparatus 1 allows the scan beam to be received by the two-dimensional area light source sensor 8 while opening camera trigger shutter 22 in such a way as to apply entrapment trigger of the two-dimensional area light receiving sensor 8 while matching the light emission timing of the laser light source 3.

Here, the control box 14 selects specific one of a plurality of mirror surfaces of the polygon mirror 5 in such a way as to count the synchronizing signal 7a in accordance with the number of surface (6 faces in this example) of the polygon mirror (rotational multiple surface mirror) 5, then, the lighting control section 19 takes a timing of light emission of the laser light source 3 in such a way as to reflect to be scanned the laser light from the laser light source 3 by only the specific mirror surface thus selected.

Further, the instrumentation section CPU 18 sends an order to the control box 14, and transmits the image data obtained in such a way as to image the image data by the two-dimensional area light receiving sensor 8 to the data storage section 10 through the control box 14.

At the same time, the control box 14 transmits the position information of the imaging position that the position detection section 16 obtains on the basis of the trigger from the position detection sensor 31 and allows the storage section 17 to store from the storage section 17 to the instrumentation section CPU 18.

Further, at this time, the position detection sensor 31 applies trigger of the position information acquisition in such a way as to match incidence timing of the scan beam into the detection system by detecting the scan beam.

The two-dimensional area light receiving sensor 8 is capable of moving in the X-direction (X axis direction) that is horizontal scan direction by the X-direction movable stage 11. For that reason, the two-dimensional area light receiving sensor 8 becomes possible to detect the scan beam at arbitrary position within the scanning area. At this time, the instrumentation section CPU 18 allows the X-direction movable stage 11 to be driven by the mechanism control section 13 through the control box 14. Since the configuration for driving is the same as that of the first embodiment of the present invention, explanation thereof is omitted. Further, instrumentation of the amount of movement of the X-direction movable stage 11 is executed by the position detection section 16 using the linear scale 15 (as another measuring unit, optical measuring unit, laser micro sensor, and so forth can be utilized) that are position detection sensors. For that reason, it is possible to measure data acquisition position of the two-dimensional area light receiving sensor 8 accurately and in high speed.

The two-dimensional area light receiving sensor 8 acquires the image data while being moved by the movable stage 11 in the X axis direction that is the horizontal scan direction. Further, this acquired image data is transmitted to the data storage section 10 through the control box 14. Such routine of acquisition and transmission of the image data is repeated across within the entire scanning region by the two-dimensional area light receiving sensor 8 controlled by the control box 14, thus the image data corresponding to one scanning line. Subsequently, the signal processing section 24 analyzes the light quantity distribution data that is imaged, then measures linearity and scanning line bend-amount on the entire scanning area of the scan optical system end.

The instrumentation section CPU 18 calculates the measurement result, then it enables indication of linearity and scanning line bend-amount to be executed by the display section 23.

Figure 15:
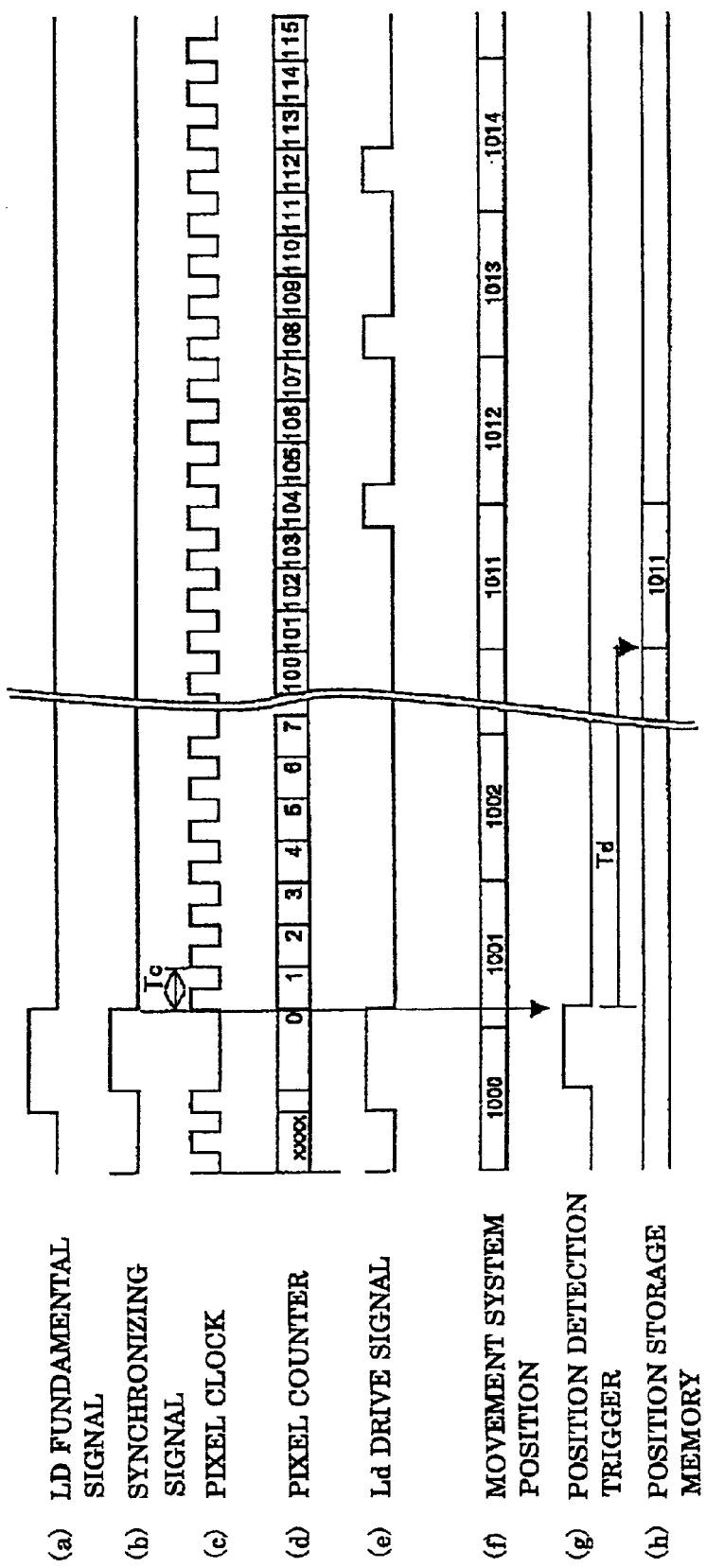
FIG. 15 is a timing chart corresponding to the scan beam measurement evaluation apparatus of FIG. 14.

FIG. 15 illustrates fundamental timing chart in the lighting control section 19 of the scan beam. In FIG. 15, (a) is a fundamental signal for executing drive control of the laser light source 3, in which the laser light source 3 is made to emit a light with certain degree of time intervals in order to obtain synchronizing signal 7a that becomes scanning start position of the scan beam while allowing the scan beam depending on the polygon mirror 5 to be received by the light receiving sensor 4.

In FIG. 15, signal of (b) is the synchronizing signal 7a of FIG. 14 obtained from light receiving signal (detected signal) of the light receiving sensor 4 that becomes light receiving trigger (trigger signal) of the two-dimensional area light receiving sensor 8.

Signal of (c) is a fundamental clock signal (pixel CLOCK) 21a of FIG. 14 that is generated at the timing of falling of (b), and is used for adjustment of deviation of clock phase produced caused by rotational irregularity and so forth of the polygon mirror 5.

Signal (d) is a counter value (pixel counter) driven by fundamental clock signal of (b), and is value (signal) that count is started after being reset to 0 at the synchronizing signal. Furthermore, the pixel counter of (d) is advanced of count value in every one cycle of fundamental clock signal of (b). Further, actual writing timing (namely its position) of the laser light source 3 is controlled by use of counter value of (d).

Signal (e) is a drive signal (Ld drive signal) that the instrumentation section CPU 18 drives actually the laser light source 3 through the lighting control section 19. Further, the instrumentation section CPU 18 enables light emission pattern of the laser light source 3 to be output in such a way as to obtain the signal of (e) from the count value of (d) on the basis of the predetermined program. For instance, in FIG. 15, the instrumentation section CPU 18 allows the laser light source 3 to emit a light depending on the lighting control 19 in such a way as to make the LD drive signal (drive signal of the laser light source 4) of (e) high in every time that the pixel counter of (d) counts four times. Thus, in FIG. 15, the time interval Tp that makes the LD drive signal high is made to set due to the quad count value of (d).

This time interval Tp is capable of being set arbitrarily. Namely, the time interval Tp is capable of being set arbitrarily in order to image the point image (dot) due to spot light of the laser light at the arbitrary position of the photosensitive body image position R in such a way as to emit the laser light source 3. Here, since the clock signal (c) is matched accurately with the synchronizing signal 7a in connection with its timing, the laser light source 3 emits a light due to the LD drive signal (e). Thus it is possible to improve considerably the repeatability of the position of the photosensitive body image position R onto which the point image (dot) is made to image depending on the spot light of the laser light.

Next, timing on detection of movement system position will be explained.

Signal (g) that is applied correspondingly to the synchronizing signal (b) is indicated as signal (position detection trigger). Further, signal (f) is one that indicates detection position when the detection system (position detection sensor 31) moves in the X-direction. Thus, since the detection system position varies every moment as the signal (f) depending of movement of the detection system, difference between the reference position and actual evaluation pattern position becomes error of the detection system position.

Further, if delay time that the system stores actually its position from the position detection trigger signal (g) is taken to be Td, since the movement system moves during this delay time, in cases where fluctuation occurs on Td, it leads to detection error of the position information.

Moreover, in the case of writing type resolution of 600 dpi to approximately 300 mm of A4 latent width, since the number of dots in the horizontal scan direction becomes at least "7000≅300 (mm)/25.4(mm/inch)×600 (dpi=dot/inch)," movement of detection system at the scanning time and jitter of the clock lead to deterioration of measurement accuracy.

In order to reduce this influence, it is possible to execute timing control while providing separately position detection triggering PD (photo diode) as described-above. However, in this case, it becomes necessary to prepare the trigger PD and its measuring circuit, or it is necessary to control light emission of the beam such that the beam enters surely the trigger PD, thus the apparatus configuration becomes complicated.

Figure 16:
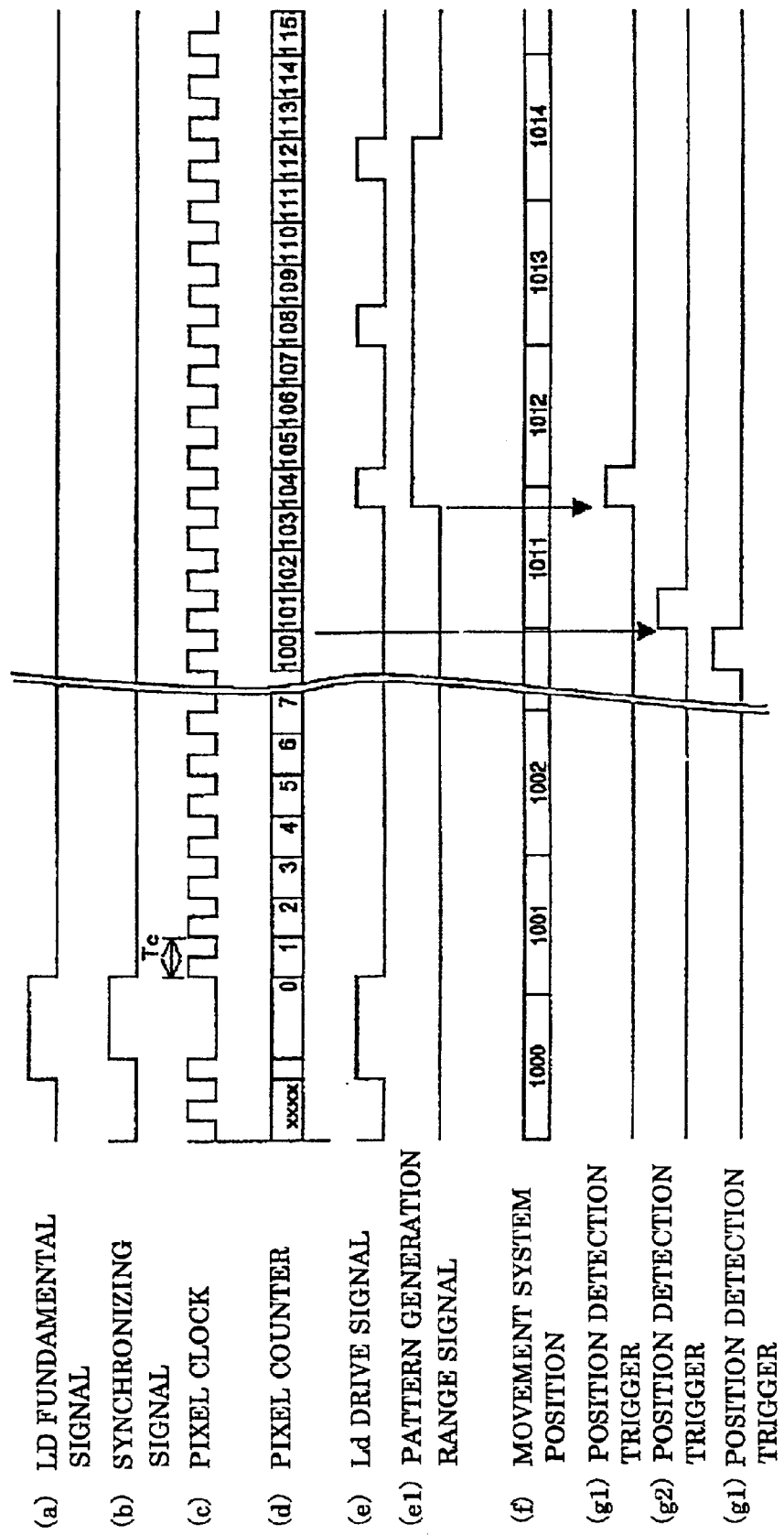
FIG. 16 is another timing chart corresponding to the scan beam measurement evaluation apparatus of FIG. 14.

In contrast, FIG. 16 illustrates an example of a position detection trigger signal depending on the scan beam light quantity distribution measurement apparatus 1 according to the present invention. Next, operations depending on the scan beam light quantity distribution measurement apparatus 1 will be explained.

A storing trigger (position detection trigger) of a signal (g1) is synchronized with a rising of a pattern generation range signal of (e1). Thereby, stable instrumentation of the detection system is executed without depending on position of the scan system. The pattern generation range signal generates scan beam evaluating pattern to evaluation object pixel.

Further, a storing trigger of a signal (g2) is generated at setting value (here, rising time of count value 101) of a pixel counter signal. For that reason, stable position instrumentation of the detection system is possible without depending on the position of the scan system, thus there is the effect that compensation can be executed at the time that delay time (above-described Td) occurs of generation of the position detection trigger signal until this signal is made to write in the data storage section 10 actually.

As described above, it became possible to reduce detection error in such a way as to reduce deviation between the pattern generation range signal and position detection time of the detection system. However, on the occasion that the apparatus is actually used, it is necessary to guarantee that light distribution section of produced evaluation pattern is acquired by the detection system.

The laser light source 3 is subjected to light emission control using the pixel counter value. Then the laser light from the laser light source 3 is scanned by the polygon mirror 5 to become a scan beam. Thus the resulting spot light of the laser light due to the scan beam is imaged as the point image onto the photosensitive body image position R. The beam position (imaging position) of the scan beam due to such pixel counter value is measured depending on detection system position output from detection system position detection means. Namely, the beam imaging position is measured by use of the position detection sensor 31 and the linear scale 15 which constitute the detection system position detection means.

Figure 17:
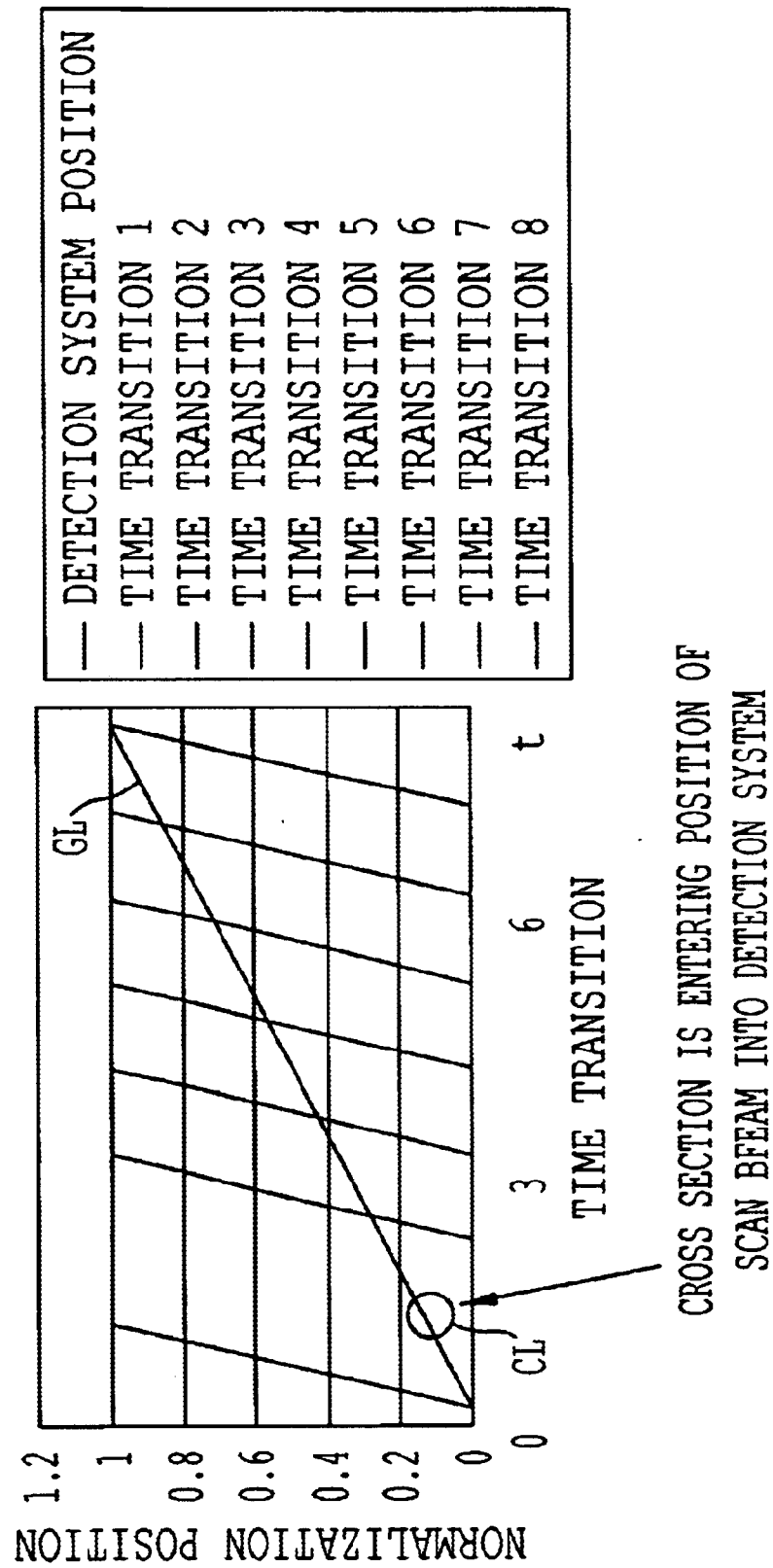
FIG. 17 is another view of the scan beam measurement evaluation apparatus of FIG. 14.

This correspondence is illustrated in FIG. 17. In the graph of this FIG. 17, relationship between line GL indicating the pixel counter and variation of beam positions 1 to 8 that the detection system position detection means detect. There is part where the line GL is crossed by the beam position 1 to 8. In this case Y axis is normalized in such a way that scanning width becomes 1. The crossed section CL indicates position where the scan beam enters the position detection sensor 31 of the detection system.

Thus, it is possible to guarantee that the light distribution section of the evaluation pattern that is generated is acquired by the detection system by generating the position detection trigger signal that is caused by the correlation between beam position that is scanned form the pixel counter value and the detection system position.

Like the standardized detection system position (predetermined detection system movement position set before hand) Ps, in the standardized beam spot position (predetermined spot imaging position set before hand) pb, the position detection trigger signal is made to generate at initial pixel rising edge that satisfies pb>ps.

As the other case, when the linearity of the movement system and scan beam is not sufficient, instrumentation of correspondence of above described pb and ps is executed before hand, and a correspondence is made to a memory storage of LUT (look up table). At the time of instrumentation, the position detection trigger signal is generated at the first pixel rising edge that satisfies pb>LUT(ps) (LUT is correspondence table between Pb and Ps) at the time of instrumentation.

According to these means, it is possible to detect the movement system detection position automatically with high accuracy without changing the evaluating of dot line pattern across the entire system.

Further, in cases where a short range pattern is used to evaluate the projection of a limited spot (one to six dot lines) the pattern generation range is changed automatically about the position where measurement system exists at the present time, depending on the relationship between pb and ps described above. Then the pattern generation start position and movement system detection position of that time are stored. Thus, it is unnecessary to control the spot position from the outer section.

Further, since the generation section of the position detection trigger signal 28 and the data storage section 10 for storing position of the position detection sensor 31 are provided, no trigger from the position detection sensor 31 is required.

Furthermore, it becomes possible to reduce the influence of the delay time Td until position of the trigger signal is stored from generation of the trigger signal by directly connecting the position detection section 16 and the means for outputting the pattern generation range signal.

Moreover, the pulse can be output from the position detection means from a detection head 15*b* of the linear scale 15. Then the pulse can be input to the position detection section 16. Then the pulse train from the detection head 15*a* or the position detection section 16 is connected to the range signal generation means that outputs pattern generation range signal directly. This allows a counter function to be included within the range signal generation means. Thus it becomes possible to reduce the cost on the entire apparatus.

According to the aforementioned configuration, since position instrumentation at the timing of actual execution of the sensor input depending on the position detection timing control becomes possible, it becomes possible to measure in relation to also micro position deviation in the vertical scan direction that is produced by vibration and/or mechanism backlash and so forth, thus, it is possible to execute measurement of the scan beam position with high accuracy.

According to the present invention, the operation is made to prepare the movable two-dimensional light receiving element to detect a scan beam by the light receiving element while moving the two-dimensional area light receiving element in the scan direction of the scan beam, and to store position information of the two-dimensional area light receiving sensor in a data storage means. Subsequently, the light quantity distribution of the scan beam scanned is analyzed while using the data of the scan beam stored in the data storage means. Thereby, it is possible to measure the dynamic light quantity distribution of the scan beam scanned in the entire scanning area of the scan optical system.

Further, the beam diameter of the scan beam is evaluated relative to the light quality distribution data, and the light quantity threshold value is set to be equivalent to the light quantity capable of transferring toner normally onto surface of the photosensitive body as the scan beam is irradiated onto the surface of the photosensitive body. Thereby it is possible to measure scan beam light quantity in accordance with light intensity capable of forming electrostatic latent image on the photosensitive body. Further it is possible to execute an evaluation that corresponds to the actual state of the scanning optical unit.

Furthermore, the scan beam emitted from the light source is modulated in such a way as to execute blinking control of the light source with the constant interval, and to receive the scan beam by the light receiving element at the imaging position. Then at the time that the operation is made to analyze the light quantity distribution of the received scan beam, it is possible to calculate the dot center-of-gravity position of respective scan beams from the light quantity distribution data that is analyzed to form a plurality of dots measured within the scanning range of the scan beam. Thus, it is possible to find a distance between dot positions of two separated points, and to find a magnification error of the scan optical system in such a way as to repeatedly find the distance between dot positions in adjacent dots. Thereby it is possible to measure the magnification error of the scan optical system.

Moreover, it is possible to calculate the dot center-of-gravity position of respective scan beams to determine the distance between dot positions of separated two points, and to determine a scanning line bend-amount from the vertical data in such a way as to repeatedly find in adjacent dots. Therefore, it is possible to measure the scanning line bend-amount of the scan optical system.

Also, it is possible to detect horizontal position information to receive the scan beam being subjected to a blinking control with a predetermined blinking interval by repeated scanning by the light receiving element while moving the two-dimensional area light receiving element with a predetermined pitch or in uniform velocity, to store position information received by the light receiving element in the data storage section, to determine a the magnification error and the scanning line bend-amount with high accuracy across the entire scanning region of the scan optical system.

Further, the measurement apparatus is provided with the light source, a selection/emission control means for selecting the light emission pattern of the scan beam emitted from the light source, scanning means for scanning the scan beam emitted from the light source in the predetermined direction, detection means consisting of the two-dimensional area type light receiving element that receives the scan beam and outputs electrical signal proportional to entrapped light quantity, movement means for moving the detection means along the scan direction of the scan beam scanned by the scanning means intermittently or continuously, position detection means for detecting position of the detection means, data storage means for storing data in relation to the light quantity of the scan beam detected by the detection means, and analysis means for analyzing the light quantity distribution of the scan beam scanned in the predetermined direction while using data stored in the data storage means. Since the measurement apparatus measures distribution of the light quantity, it is possible to execute dynamic light quantity distribution measurement of the scan beam in a scanning area on the entire scanning region of the scanning optical unit that becomes measured body, and it is possible to measure the light quantity distribution corresponding to one pixel in approximately the same condition (setting of exposure time and so forth) as the actual use in the entire scanning region. Thus it is possible to determine an accurate position of an abnormal portion containing a profile irregularities (undulation), a surface defect, an internal defect and so forth of the optical element within the scan optical system that contribute to occurrence of fault.

Further, the selection/emission control means have a configuration in which the light quantity of the scan beam, the time of light emission, selection as to whether the light source is made to execute lighting by only 1 point (1 time) during one scanning period, as to whether the light source is made to execute light emission continuously to form continuous light, or as to whether the light source is made to execute lighting with constant time intervals, lighting position and selection of the light quantity are preset to be stored therein, and the selection/emission control means allow light emission to be executed in accordance with the stored light emission patterns. Thereby, it is possible to execute the light quantity distribution measurement in accordance with the light emission pattern in such a way as to select the light emission pattern within one scanning period of the scan beam. Accordingly, it is possible to execute variously evaluation of the scan optical system unit. For instance, as to setting of light quantity of light emission, there are a case of full light quantity and a case of halftone, it is also possible to measure to be evaluated the light quantity distribution while separating the case of the full light quantity from the case of the halftone. Further, in the case of the halftone, since the light quantity itself of the scan beam is halved, it is possible to evaluate with high sensitivity to slight abnormality of the optical element. Furthermore, when using continuous light, it is possible to detect local drop of the light quantity in the entire area of the scan optical system.

Further, the scan beam is made to modulate with pixel unit in such a way as to execute lighting of the scan beam with constant time interval, thereby it is possible to execute detection of the magnification error and the scanning line bend-amount from the data in the horizontal scan direction of the scan beam while calculating the dot center-of-gravity position of the scan beam to a plurality of dots measured within the scanning region of the scan beam.

Further, the analysis means measures the beam diameter of the scan beam with a light quantity threshold value capable of being set arbitrarily from the light quantity distribution in the horizontal scan direction and in the vertical scan direction at right angle to the horizontal scan direction of the scan beam, and evaluates the scan beam diameter. Since the operation sets the light quantity threshold value arbitrarily, it can be set about the same light quantity as one in which toner is capable of being transferred normally onto surface of the photosensitive body as the scan beam is irradiated onto the surface of the photosensitive body. Thereby it is possible to measure the scan beam with the light quantity in accordance with light intensity capable of forming electrostatic latent image on the photosensitive body. Further it is possible to conduct an evaluation that corresponds to the actual state to the scanning optical unit.

Further, on the occasion of high density measurement, the two-dimensional area type light receiving element is used with the detection optical system. Therefore, a detection region cannot be large. As a result, it is necessary to butt detection data together. However, since the present invention is capable of capturing position information corresponding to high speed movement and high accuracy, it is possible to detect an absolute position of the scan beam on the basis of the position without increasing absolute positioning accuracy of the movement mechanism. Also, it is possible to accurately measure the magnification error or the scanning line bend-amount on the entire scanning area of the scan optical system.

Thus, it is possible to determine an accurate position of abnormal portion of the optical element containing one of the profile irregularities (undulation), a surface defect, an internal defect and so forth that contribute to a fault in the image formation in such a way as to measure the magnification error or the scanning line bend-amount in the entire scanning area. Further, it is possible to determine a specification value of the profile irregularities (undulation), the surface defect, the internal defect, and so forth in such a way as to determine a correspondence between an amount of deviation and the magnification error by evaluating abnormal state quantitatively. Thus the specification value is capable of being reflected to design specification of the optical element.

Also, since the position of the movement means is always detect by the position detection means, even though the image data is acquired with the two-dimensional area light receiving element is moved it is possible to reduce considerably measurement time without decreasing measurement accuracy.

Also, there is provided reference position detection means for detecting reference position of scanning and synchronizing signal generation means for generating synchronizing signal. The selection/emission control means receive the scanning synchronizing signal generated by the synchronizing signal generation means after the scan beam is detected by the reference position detection means. Light is then emitted during only one scanning period using a light emission pattern selected in synchronization with this signal. Thereby it is possible to output selected light emission pattern during one scanning period on the basis of the scanning synchronizing signal. Thus it is possible to scan with a required pattern at an arbitrary position. Thus, it is possible to analyze characteristic of specific portion of the scan optical system in detail.

Also, since the selection/emission control means allows the scan beam to scan in approximately the same condition as the actual use, it is possible to evaluate the light quantity distribution of the scan optical system unit under approximately the same condition as the actual use of the scan beam.

Also, it is possible to select the scan beam to be measured by opening and closing the shutter in such a way as to select only required number of the scanning lines in synchronization with the scanning synchronization signals generated by the synchronizing signal generation means.

Also, the detection data detected by the two-dimensional area light receiving element is stored sequentially in the data storage means in high speed. Thus, input data can be eliminated, and repeated detections are possible. Thus it is possible to achieve high speed measurement.

Also, the two-dimensional area light receiving element is capable of receiving a removable enlargement optical element. The element enlarges a spot image of the scan beam. Therefore, it is possible to increase resolution of the two-dimensional area light receiving element. Thus it is possible to improve measurement accuracy of the light quantity distribution, the magnification error, and scanning line bend-amount.

Also, the selection/emission control means receives the scanning synchronization signal from the reference position detection means, and allows synchronized scanning to be started while matching the timing of acquisition of this signal. Thereby it is possible to evaluate the beam diameter of the scan optical system in such a way as to perform signal processing of the scanning light quantity distribution data acquired from the two-dimensional light receiving element. Thus, the beam diameter and the peak light quantity is measured in accordance with the light quantity threshold value matched to the photosensitive body sensitivity. Thereby it is possible to detect these abnormal values. Finally, it is possible to specify abnormality of profile irregularities (undulation), surface defect, internal defect, and so forth to contribute to occurrence of faulty on the image formation.

Also, the scanning means has the polygon mirror, and the selection/emission control means allows only the scan beam scanned at specific surface of the polygon mirror to be used in such a way as to count the scanning synchronization signal from the reference position detection means. Thereby it is possible to increase the dot position repeatability of the scan beam without influence from the polygon mirror surface. Thus it is possible to accurately detect magnification error and scanning bend-amount across the entire scanning area in such a way as to execute butting processing of the imaging data, after repeating acquisition while changing the imaging position when the two-dimensional area light receiving element is moved.

Further, the position detection means have a position detection triggering photo diode which is capable of obtaining position information in the horizontal scan direction of the two-dimensional area light receiving element at incidence timing of the scan beam to the two-dimensional area light receiving element. Therefore, the position detection means acquires position information at the time point that the position detection triggering photo diode detects the scan beam. The position detection means can remove acquisition error from the position information accompanying movement of the two-dimensional area light receiving sensor. As a result, it is possible to acquire position information at the time of image data capture when the two-dimensional area light receiving element is moved.

Also, the scan beam measurement evaluation apparatus is provided with reference position detection means for detecting a reference scan start position from a scanning optical apparatus that executes exposure scanning of electrostatic latent image, evaluation pattern generation means for generating scan beam evaluating pattern to evaluate an object pixel, light emission element control means for controlling the light emission element that irradiates light to the polygon mirror of the scanning optical apparatus on the basis of the pattern, light detection means for receiving to be detected the light quantity distribution of the scan beam by use of light receiving element, movement means for moving the light receiving element in the horizontal scan direction, position detection means for detecting a position of the light receiving element, and measurement evaluation means for measuring a position of the scan beam. Thus, the position of the light receiving element detected by the position detection means, or stored in synchronism with the scan beam evaluating pattern, and the scan beam is detected by the light detection means while moving the light receiving element in the beam horizontal scan direction by use of the movement means. Accordingly, it is possible to measure a position of the entire scan system with high accuracy and to acquire position information of movement system in synchronism with the detection evaluation pattern.

Also, in this scan beam measurement evaluation apparatus, the position detection means detects the position of the vertical scan direction at the same time that the light receiving element detects the position of the horizontal scan direction. Further the measurement evaluation means store these respective positions to support evaluation of the scan beam. Accordingly, it is possible to perform instrumentation with high accuracy in such a way as to reduce influence of position deviation in the vertical direction that is caused by backlash of the mechanism in the vertical direction or by vibration.

Also, in this scan beam measurement evaluation apparatus, the measurement evaluation means stores a position of the light receiving element in synchronism with a generation range of the scan beam evaluating pattern. Accordingly, it is possible to instrument the position of the entire scan system in the horizontal scan direction with high accuracy in such a way as to acquire the position information of the movement system in synchronism with the detection evaluation pattern.

Also, in this scan beam measurement evaluation apparatus, the measurement evaluation means stores a position of the light receiving element in synchronism with a detection trigger signal generated at the trigger position at the time of actual scanning pattern generation. Accordingly, it is possible to instrument the position of the entire scan system in the horizontal scan direction with high accuracy in such a way as to acquire the position information of the movement system in synchronism with the detection evaluation pattern.

Also, in this scan beam measurement evaluation apparatus, the measurement evaluation means compares the writing pixel position added up from the reference position signal with the position of the light receiving element obtained from the position detection means, and stores the position of the light receiving element in synchronism with the condition determined beforehand. Accordingly, it is possible to improve measurement accuracy relative to the measurement evaluation pattern and the detection system position.

Also, in this scan beam measurement evaluation apparatus, the measurement evaluation means stores the position of the light receiving element in such a way that the position of the position detection means is made to synchronize with the first pixel clock signal after the position of the scan beam is passed through. This is determined by both the beam position determined from the pixel counter addition value and the position information of the position detection means as the condition for storing the position of the light receiving element. Accordingly, it is possible to improve measurement accuracy relative to the measurement evaluation pattern and the detection system position.

Also, the measurement evaluation means stores the beam position determined from the pixel counter addition value corresponding to the position information of the position detection means. After the scan beam is passed through the correspondence position of the position detection means, the light receiving element position is stored in synchronism with the first pixel clock signal. Accordingly, it is possible to improve the accuracy of the instrumentation.

Also, in this scan beam measurement evaluation apparatus, the measurement evaluation means produces the scan beam evaluating pattern on the basis of the position information of the light detection means input continuously, and stores the position information of the light receiving element and start position of the scan beam evaluating pattern in synchronism therewith. Then the measurement evaluation means measures the scan beam position relative to respective position information. Accordingly, it is possible to provide high accuracy instrumentation based on a comparison between the measurement evaluation pattern and the detection system position.

Also, in this scan beam measurement evaluation apparatus, the position detection means output the pulse train signal, and the evaluation pattern generation means have counter means for counting the number of pulse of the pulse train signal. Accordingly, it is possible to reduce manufacturing cost.

Also, an electrophotographic image formation apparatus is provided with the above-described scan beam measurement apparatus, and may be provided with the same benefits as that of the above scan beam measurement evaluation apparatus.

What is claimed is:

1. An apparatus for measuring distribution of a light of a scan beam which is scanned in a predetermined direction, said apparatus comprising:
   a two dimensional light receiving element movable in said predetermined direction and configured to detect said scan beam;
   a data storing device configured to store scan beam data, including the scan beam detected by the two dimensional light receiving element, and corresponding two-dimensional light receiving element positional information; and an analyzing device configured to analyze the distribution of said light of said scan beam and said stored scan beam data, wherein said two-dimensional type light receiving element is further configured to detect a spot of the scan beam.

2. A scan beam light quantity distribution measurement apparatus comprising:

a light source configured to emit a scan been according to a predetermined light emission pattern;

a selection/emission control device configured to select said predetermined light emission pattern from a plurality of patterns;

a scanning device configured to scan the scan beam in a predetermined direction;

a light detection device having a two-dimensional light receiving element configured to detect light from the scan bean and to output an electrical signal proportional to the detected light;

a movement device connected to said light detection device and configured to move either intermittently or continuously along said predetermined direction;

a position detection device connected to said light detection device and configured to detect a position of said detection device;

a data storage device connected to said light detection device and configured to store data corresponding to the detected light; and an analysis device connected to said data storage device and configured to analyze data stored in said data storage device, wherein said two-dimensional light receiving element comprises an optical enlargement element.

3. A scan beam light quantity distribution measurement apparatus comprising:

a light source configured to emit a scan beam according to a predetermined light emission pattern;

a selection/emission control device configured to select said predetermined light emission pattern from a plurality of patterns;

a scanning device configured to scan the scan beam source in a predetermined direction;

a light detection device having a two-dimensional light receiving element configured to detect light from the scan bean and to output an electrical signal proportional to light;

a movement device connected to said light detection device and configured to move either intermittently or continuously along said predetermined direction;

a position detection device connected to said light detection device and configured to detect a position of said light detection device;

a data storage device connected to said light detection device and configured to store data; and an analysis device connected to said data storage device and configured to analyze data stored in said data storage device, wherein said position detection device comprises a position detection triggering photo-diode and is configured to acquire horizontal scan position information, and said selection/emission control device is configured to set and store following parameters a scan beam output intensity, a time of light emission, a light source mode of operation, and a lighting position corresponding to said output intensity and said light emission time.

4. A scan beam light quantity distribution measurement apparatus comprising:

a light source configured to emit a scan beam according to a predetermined light emission pattern;

a selection/emission control device configured to selected said predetermined light emission pattern from a plurality of patterns;

a scanning device configured to scan the scan beam in a predetermined direction;

a light detection device having a two-dimensional light receiving element configured to detect light from the scan beam and to output an electrical signal proportional to the detected light;

a movement device connected to said light detection device and configured to move either intermittently or continuously along said predetermined direction;

a position detection device connected to said light detection device and configured to detect a position of said detection device;

a data storage device connected to said light detection device and configured to store data corresponding to the detected light;

an analysis device connected to said data storage device and configured to analyze the data stored in said data storage device;

a reference position detection device configured to detect a scan start reference position of said scan beam; and a synchronizing signal generation device configured to generate a scan synchronizing signal, wherein said selection/emission control device is further configured to receive said scan synchronizing signal after the scan start reference position is detected by said reference position detection device, and is configured to control light emission in correspondence to a scanning period, corresponding to the selected light emission pattern, and in synchronism with the scan synchronizing signal, and said two-dimensional area light receiving element comprises a light receiving surface that can be opened and closed in synchronism with the scan synchronizing signal by use of a shutter so as to selectively receive a predetermined number of scan lines after the scan start reference position is detected by said reference position detection device, and is configured to output to said data storage section accumulated charges corresponding to received light and to remove said accumulated charges.

5. A scan beam measurement evaluation apparatus, comprising:

a reference position detection device configured to detect a scan start reference position of a scan beam output from a scanning optical apparatus, said scanning optical apparatus having a polygon mirror and configured to perform exposure scanning of an electrostatic latent image;

an evaluation pattern generation device configured to generate a scan beam pattern corresponding to a pixel to be evaluated;

a light emission element control device configured to control a light emission element so the light emission element emits light to said polygon mirror in accordance with said scan beam pattern;

a light receiving element having a light detection device configured to detect a distribution of light of said scan beam;

a movement device connected to said light receiving element and configured to move said light receiving element in a scan direction;

a position detection device configured to detect a position of said light receiving element; and a measurement evaluation device used upon detection of said scan beam based on the scan beam evaluating pattern while moving said light receiving element in beam horizontal scan direction by said movement device, for storing the position of the light receiving element detected by the position detection device, in synchronism with the scan beam evaluating pattern and evaluating position of said light receiving element according to the scan beam position detected by the light detection device and the light receiving element position detected by the position detection device; wherein said measurement evaluation device stores position of said light receiving element in synchronism with detection trigger signal generated at the trigger position upon generation of an actual scanning pattern concerning the scan beam evaluating pattern set independently and the detection trigger position of position of said light receiving element.

6. A scan beam measurement evaluation apparatus, comprising:

a reference position detection device configured to detect a scan start reference position of a scan beam output from a scanning optical apparatus, said scanning optical apparatus having a polygon mirror and configured to perform exposure scanning of an electrostatic latent image;

an evaluation pattern generation device configured to generate a scan beam pattern corresponding to a pixel to be evaluated;

a light emission element control device configured to control a light emission element so the light emission element emits light to said polygon mirror in accordance with said scan beam pattern;

a light receiving element having a light detection device configured to detect a distribution of light of said scan beam;

a movement device connected to said light receiving element and configured to move said light receiving element in a scan direction;

a position detection device configured to detect a position of said light receiving element; and a measurement evaluation device used upon detection of said scan beam based on the scan beam evaluating pattern while moving said light receiving element in beam horizontal scan direction by said movement device, for storing the position of the light receiving element detected by the position detection device, in synchronism with the scan beam evaluating pattern and evaluating position of said light receiving element according to the scan beam position detected by the light detection device and the light receiving element position detected by the position detection device; wherein and said measurement evaluation device stores position of said light receiving element in synchronism with a predetermined condition, while comparing writing pixel position accumulated from reference position signal with position of the light receiving element obtained from said position detection device.

7. A scan beam measurement evaluation apparatus, comprising:

a reference position detection device configured to detect a scan start reference position of a scan beam output from a scanning optical apparatus, said scanning optical apparatus having a polygon mirror and configured to perform exposure scanning of an electrostatic latent image;

an evaluation pattern generation device configured to generate a scan beam pattern corresponding to a pixel to be evaluated;

a light emission element control device configured to control a light emission element so the light emission element emits light to said polygon mirror in accordance with said scan beam pattern;

a light receiving element having a light detection device configured to detect a distribution of light of said scan beam;

a movement device connected to said light receiving element and configured to move said light receiving element in a scan direction;

a position detection device configured to detect a position of said light receiving element; and a measurement evaluation device used upon detection of said scan beam based on the scan beam evaluating pattern while moving said light receiving element in beam horizontal scan direction by said movement device, for storing the position of the light receiving element detected by the position detection device, in synchronism with the scan beam evaluating pattern and evaluating position of said light receiving element according to the scan beam position detected by the light detection device and the light receiving element position detected by the position detection device; wherein said measurement evaluation device stores position of said light receiving element in synchronism with a predetermined condition, while comparing writing pixel position accumulated from reference position signal with position of the light receiving element obtained from said position detection device; and said measurement evaluation device finds as the predetermined condition a first pixel clock signal after the scan beam has passed position of the position detection device by using the beam position determined by the accumulated value of the pixel counter and the position information of the position detection device, and stores the position of the light receiving element in synchronism with this first pixel clock signal.

8. A scan beam measurement evaluation apparatus, comprising:

a reference position detection device configured to detect a scan start reference position of a scan beam output from a scanning optical apparatus, said scanning optical apparatus having a polygon mirror and configured to perform exposure scanning of an electrostatic latent image;

an evaluation pattern generation device configured to generate a scan beam pattern corresponding to a pixel to be evaluated;

a light emission element control device configured to control a light emission element so the light emission element emits light to said polygon mirror in accordance with said scan beam pattern;

a light receiving element having a light detection device configured to detect a distribution of light of said scan beam;

a movement device connected to said receiving element and configured to move said light receiving element in a scan direction;

a position detection device configured to detect a position of said light receiving element; and a measurement evaluation device used upon detection of said scan beam based on the scan beam evaluating pattern while moving said light receiving element in beam horizontal scan direction by said movement device, for storing the position of the light receiving element detected by the position detection device, in synchronism with the scan beam evaluating pattern and evaluating position of said light receiving element according to the scan beam position detected by the light detection device and the light receiving element position detected by the position detection device; wherein said measurement evaluation device stores position of said light receiving element in synchronism with a predetermined condition, while comparing writing pixel position accumulated from reference position signal with position of the light receiving element obtained from said position detection device; and said measurement evaluation device finds a beam position determined by an accumulated value of the pixel counter corresponding to the position information of the position detection device, and uses a first pixel clock signal after the scan beam has passed this beam position, as the predetermined condition for storing position of the light receiving element when storing position of the light receiving element in synchronism with the first pixel clock signal.

9. A scan beam measurement evaluation apparatus, comprising:

a reference position detection device configured to detect a scan start reference position of a scan beam output from a scanning optical apparatus, said scanning optical apparatus having a polygon mirror and configured to perform exposure scanning of an electrostatic latent image;

an evaluation pattern generation device configured to generate a scan beam pattern corresponding to a pixel to be evaluated;

a light emission element control device configured to control a light emission element so the light emission element emits light to said polygon mirror in accordance with said scan beam pattern;

a light receiving element having a light detection device configured to detect a distribution of light of said scan beam;

a movement device connected to said light receiving element and configured to move said light receiving element in a scan direction;

a position detection device configured to detect a position of said light receiving element; and a measurement evaluation device used upon detection of said scan beam based on the scan beam evaluating pattern while moving said light receiving element in beam horizontal scan direction by said movement device, for storing the position of the light receiving element detected by the position detection device, in synchronism with the scan beam evaluating pattern and evaluating position of said light receiving element according to the scan beam position detected by the light detection device and the light receiving element position detected by the position detection device; wherein said measurement evaluation device stores position of said light receiving element in synchronism with a predetermined condition, while comparing writing pixel position accumulated from reference position signal with position of the light receiving element obtained from said position detection device; and wherein said measurement evaluation device is configured to generate said scan beam evaluating pattern set on the basis of the position information of said light detection device input, store said position information of said light receiving element and a start position of said scan beam evaluating pattern, and evaluate a detected scan beam position.

10. A scan beam measurement evaluation apparatus, comprising:

a reference position detection device configured to detect a scan start reference position of a scan beam output from a scanning optical apparatus, said scanning optical apparatus having a polygon mirror and configured to perform exposure scanning of an electrostatic latent image;

an evaluation pattern generation device configured to generate a scan beam pattern corresponding to a pixel to be evaluated;

a light emission element control device configured to control a light emission element so the light emission element emits light to said polygon mirror in accordance with said scan beam pattern;

a light receiving element having a light detection device configured to detect a distribution of light of said scan beam;

a movement device connected to said light receiving element and configured to move said light receiving element in a scan direction;

a position detection device configured to detect a position of said light receiving element; and a measurement evaluation device used upon detection of said scan beam based on the scan beam evaluating pattern while moving said light receiving element in beam horizontal scan direction by said movement device, for storing the position of the light receiving element detected by the position detection device, in synchronism with the scan beam evaluating pattern and evaluating position of said light receiving element according to the scan beam position detected by the light detection device and the light receiving element position detected by the position detection device; wherein said position detection device is configured to output a pulse-string signal, and said evaluation pattern generation device includes counter device for counting the number of pulses in the pulse-string signal.

* * * * *